(12) United States Patent
Hou

(10) Patent No.: US 11,656,304 B2
(45) Date of Patent: May 23, 2023

(54) RADIO FREQUENCY COIL AND COIL ASSEMBLY THEREOF

(71) Applicant: SHANGHAI UNITED IMAGING HEALTHCARE CO., LTD., Shanghai (CN)

(72) Inventor: Xiangming Hou, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 17/645,061

(22) Filed: Dec. 20, 2021

(65) Prior Publication Data

US 2022/0291309 A1 Sep. 15, 2022

(30) Foreign Application Priority Data

Mar. 12, 2021 (CN) .......................... 202110272344.8
Apr. 27, 2021 (CN) .......................... 202110461668.6

(51) Int. Cl.
*G01R 33/34* (2006.01)
*G01R 33/30* (2006.01)
*G01R 33/36* (2006.01)

(52) U.S. Cl.
CPC ....... *G01R 33/34092* (2013.01); *G01R 33/30* (2013.01); *G01R 33/3628* (2013.01)

(58) Field of Classification Search
CPC .............. G01R 33/30; G01R 33/34092; G01R 33/3628
See application file for complete search history.

(56) References Cited

U.S. PATENT DOCUMENTS

| | | | |
|---|---|---|---|
| 2015/0115962 A1* | 4/2015 | Culver | G01R 33/34084 29/605 |
| 2019/0277927 A1* | 9/2019 | Stickle | A61B 5/0042 |
| 2019/0328271 A1 | 10/2019 | Rabinovitz | |

FOREIGN PATENT DOCUMENTS

| CN | 105286864 A | 2/2016 |
|---|---|---|
| CN | 106680745 A | 5/2017 |
| CN | 110558987 A | 12/2019 |

* cited by examiner

*Primary Examiner* — Gregory H Curran
(74) *Attorney, Agent, or Firm* — Metis IP LLC

(57) ABSTRACT

A magnetic resonance imaging (MRI) coil device is provided. The device includes a first receiver coil portion, a second receiver coil portion, and a locking mechanism. The second receiver coil portion is configured to fit with the first receiver coil portion to provide a receiver coil assembly. The second receiver coil portion is moveable relative to the first receiver coil portion. The locking mechanism is configured to limit relative movement between the first receiver coil portion and the second receiver coil portion when the first receiver coil portion and the second receiver coil portion are fit together.

20 Claims, 17 Drawing Sheets

RADIO FREQUENCY COIL AND COIL ASSEMBLY THEREOF

CROSS-REFERENCE TO RELATED APPLICATIONS

This application claims priority of Chinese Patent Application No. 202110461668.6 filed on Apr. 27, 2021 and Chinese Patent Application No. 202110272344.8 filed on Mar. 12, 2021, the entire contents of each of which are hereby incorporated by reference.

TECHNICAL FIELD

The present disclosure generally relates to a medical device and system, and more particularly, to a radiofrequency (RF) coil for a magnetic resonance (MR) device and system.

BACKGROUND

At present, MR devices and systems generally include one or more antennas (referred to RF coils, MR coils) for broadcasting RF signals to an object (e.g., a patient) and/or receiving return signals. Of the many developments in various aspects in RF coils, one of the rapidly growing areas concerns the functional design and structural design of the RF coils. However, adding new functions always means more volume and weight of the RF coils. For example, a receive-transmit RF coil with both transmitting and receiving functions is generally bigger and heavier than a receive-only RF or transmit-only RF coil with only one function. Therefore, it is desirable to provide devices and systems with more functions but with smaller even no cost of weight, volume, and/or manufacture and use complexity.

SUMMARY

In accordance with some embodiments of the disclosed subject matter, an RF coil and locking structures are provided.

One aspect of the present disclosure relates to a magnetic resonance imaging (MRI) coil device. The device may include a first receiver coil portion, a second receiver coil portion, and a locking mechanism. The second receiver coil portion may be configured to fit with the first receiver coil portion to provide a receiver coil assembly. The second receiver coil portion may be moveable relative to the first receiver coil portion. The locking mechanism may be configured to limit relative movement between the first receiver coil portion and the second receiver coil portion when the first receiver coil portion and the second receiver coil portion are fit together.

In some embodiments, the device may further include a transmitter coil assembly. The transmitter coil assembly may include a first shell. The first shell may define a cavity. The second receiver coil portion may be fixed in an upper portion of the cavity. The first shell may be configured to support a transmitter coil of the transmitter coil assembly.

In some embodiments, the second receiver coil portion may be an upper portion of the receiver coil assembly. The first receiver coil portion may be a lower portion of the receiver coil assembly.

In some embodiments, the first receiver coil portion may include a second shell. The locking mechanism may connect the first shell with the second shell to limit relative movement between the first shell and the second shell, so that the relative movement of the second receiver coil portion to the first receiver coil portion may be limited.

In some embodiments, the first shell may include a first connector end, the second shell may include a second connector end, wherein the first connector end and the second connector end are complementary.

In some embodiments, the second shell may include a container groove extending along an axial direction of the second shell. The container groove may be configured to support an object. In some embodiments, the container groove may include a first end and a second end along the axial direction of the second shell. The first end may be an end from which the object moves in and out of the container groove. The second end may be higher than the first end to allow the container groove to tilt along the axial direction of the second shell.

In some embodiments, the first shell may include a tube-shaped structure. The second receiver coil portion may be arranged inside of the tube-shaped structure. A space between the second receiver coil portion and the transmitter coil may be formed by a part of the tube-shaped structure.

In some embodiments, the transmitter coil may be arranged on an outside surface of the tube-shaped structure.

In some embodiments, the second receiver coil portion may include a second receiver coil and an upper supporting structure configured to support the second receiver coil.

In some embodiments, the upper supporting structure may include a window. The first shell may include a channel for observation. The channel may extend from an end of the first shell to the window.

In some embodiments, a periscope may be positioned at a location of the window. The periscope may be arranged at an angle to an extension direction of the channel.

In some embodiments, the second receiver coil portion may include a first supporting structure and a second supporting structure, the first supporting structure being positioned at a first end of the second receiver coil portion, and the second supporting structure being positioned at a second end of the second receiver coil portion. The transmitter coil assembly may be moveable in a range limited by the first supporting structure and the second supporting structure.

In some embodiments, the second receiver coil portion further may include a connecting rod connected to both the first supporting structure and the second supporting structure. The connecting rod may be configured to support the transmitter coil assembly. The transmitter coil assembly is moveable along the connecting rod.

In some embodiments, the transmitter coil assembly may include a through hole. The connecting rod may pass through the through hole.

Another aspect of the present disclosure relates to a method. A receiver coil assembly may be provided, wherein the receiver coil assembly may include a second receiver coil portion and a first receiver coil portion. A locking mechanism may be configured to limit relative movement between the second receiver coil portion and the first receiver coil portion when the second receiver coil portion and the first receiver coil portion are fit together. The second receiver coil portion may be caused to move relatively to the first receiver coil portion of the receiver coil assembly until the second receiver coil portion and the first receiver coil portion are fit together. The second receiver coil portion may be locked with the first receiver coil portion based on a locking mechanism to set a relative movement limitation between the second receiver coil portion and the first receiver coil portion.

In some embodiments, the second receiver coil portion may be unlocked from the first receiver coil portion by releasing the locking mechanism to revoke the relative movement limitation between the second receiver coil portion and the first receiver coil portion.

In some embodiments, the locking mechanism may include a knob, the locking the second receiver coil portion with the first receiver coil portion based on a locking mechanism may include rotating the knob along a first direction.

In some embodiments, the second receiver coil portion may be fixed to a transmitter coil assembly. The causing the second receiver coil portion of a receiver coil assembly to move relatively to the first receiver coil portion of the receiver coil assembly may include causing the transmitter coil assembly to move toward the first receiver coil portion.

In some embodiments, the second receiver coil portion may include a connecting rod configured to support the transmitter coil assembly. The causing the transmitter coil assembly to move toward the first receiver coil portion may include causing the transmitter coil assembly to move along the connecting rod.

Another aspect of the present disclosure relates to a locking mechanism. The locking mechanism may include a locking assembly connected to a first coil structure and an adjusting assembly connected to a second coil structure.

The locking mechanism may be configured with a locking mode or an unlocking mode. When the locking mechanism works in the locking mode, the adjusting assembly may be locked by the locking assembly and relative movement between the first coil structure and the second coil structure may limited by the locking mechanism.

In some embodiments, the adjusting assembly may include a mounting shell fixed to the second coil structure, and an adjusting rod covered by the mounting shell. The adjusting rod may be moveable along a first direction. Before the adjusting rod reaches a first position, the adjusting rod may be configured to move along with the mounting shell along the first direction.

In some embodiments, before the adjusting rod reaches the first position, rotation of the adjusting rod may be limited by a self-locking assembly.

In some embodiments, the self-locking assembly may be sheathed on the adjusting rod. The self-locking assembly may be moveable relatively to the mounting shell along the first direction. A movement of the self-locking assembly along the first direction may be limited by a limiting position that is determined based on the first position.

In some embodiments, the self-locking assembly may be not rotatable. Before the adjusting rod reaches the first position, the adjusting rod may be connected to the self-locking assembly to limit the rotation of the adjusting rod.

In some embodiments, the self-locking assembly may include a self-locking slide and an elastic component. The self-locking slide may be connected to the elastic component. The self-locking slide is positioned between the adjusting rod and the elastic component.

In some embodiments, the self-locking slide may include a locking protuberance. The adjusting rod may include a self-locking groove. The locking protuberance may be configured to fit with the self-locking groove to limit the rotating of the adjusting rod.

In some embodiments, the first position may be where the self-locking assembly is blocked from moving relatively to the locking assembly along the first direction.

In some embodiments, the first direction may be a direction along which the first coil structure is moved toward the second coil structure. After the adjusting rod passes the first position along the first direction, the adjusting rod may be configured to move along the first direction by rotating the adjusting rod.

In some embodiments, wherein the locking assembly may include a locking shell fixed to the first coil structure. Locking the adjusting assembly by the locking assembly may include a movement of the adjusting rod along the first direction is limited by the locking shell.

In some embodiments, an end of the adjusting rod may include a spiral groove. The locking shell may include a locking protuberance. The locking protuberance may be configured to fit with the spiral groove to lock the adjusting rod.

In some embodiments, the adjusting assembly may further include a knob. The knob may be positioned outside the second coil structure. The knob may be configured to drive the adjusting rod to rotate.

In some embodiments, wherein the knob may include a spanner or a rocker arm.

In some embodiments, the first coil structure may include a first receiver coil portion. The second coil structure may include a second receiver coil portion and a transmitter coil assembly. The first receiver coil portion may be configured to fit with the second receiver coil portion to provide a receiver coil assembly. The transmitter coil assembly may be configured to transmit radiofrequency signals. The receiver coil assembly may be configured to receive echo signals corresponding to the radiofrequency signals.

In some embodiments, the mounting shell may include a first fixing groove extending along a circumferential direction of the mounting shell. The second adjusting rod may include a second fixing groove surrounding around the adjusting rod. The second coil structure may include a fixing block. The fixing block may be configured to pass through the first fixing groove to extend into the second fixing groove.

Another aspect of the present disclosure relates to a method. An adjusting assembly may be caused to move toward a locking assembly along a first direction before an adjusting rod reaches a first position. The adjusting assembly may be fixed to a second coil structure and the locking assembly is fixed to a first coil structure. After the adjusting rod passes the first position along the first direction, a knob of the adjusting assembly may be rotated to drive the adjusting rod further to move toward the locking assembly. The adjusting assembly may be locked by the locking assembly.

In some embodiments, wherein before the adjusting rod reaches the first position, rotation of the adjusting rod may be limited by a self-locking assembly.

In some embodiments, wherein the locking assembly may include a locking shell fixed to the first coil structure. The locking the adjusting assembly by the locking assembly may include limiting a movement of the adjusting rod along the first direction by the locking shell.

In some embodiments, a head of the adjusting rod may include a spiral groove. The locking shell may include a locking protuberance. The locking protuberance may be configured to fit with the spiral groove to lock the adjusting rod.

In some embodiments, the knob may be positioned outside the second coil structure. The knob may include a spanner or a rocker arm.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting examples, in which like reference numerals represent similar structures throughout the several views of the drawings, and wherein.

DETAILED DESCRIPTION

Figure 1:
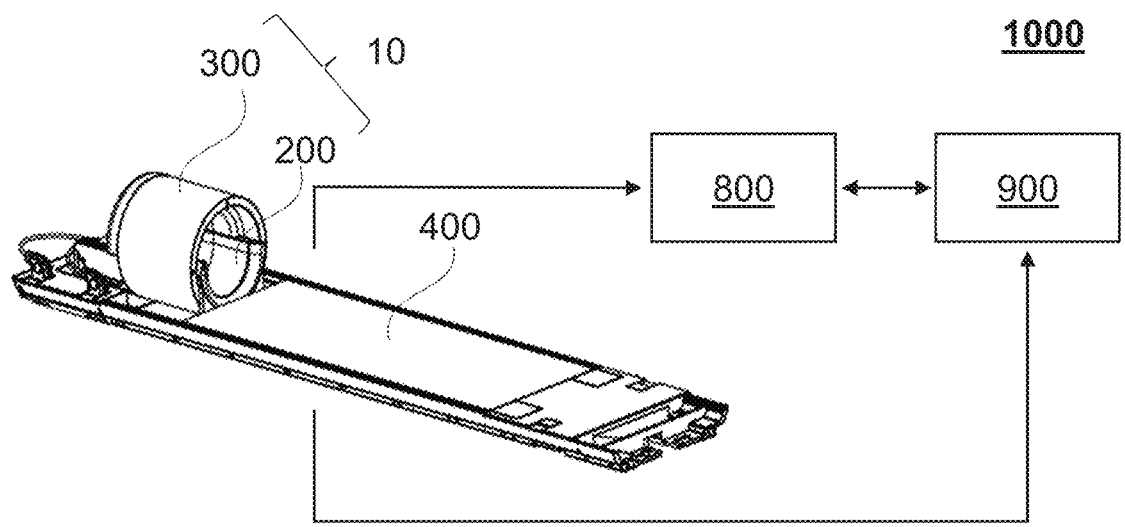
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

It will be understood that the term "system," "unit," "module," and/or "block" used herein are one method to distinguish different components, elements, parts, section, or assembly of different level in ascending order. However, the terms may be displaced by another expression if they may achieve the same purpose.

It will be understood that when a unit, module or block is referred to as being "on," "connected to" or "coupled to" another unit, module, or block, it may be directly on, connected or coupled to the other unit, module, or block, or intervening unit, module, or block may be present, unless the context clearly indicates otherwise. As used herein, the term "and/or" includes any and all combinations of one or more of the associated listed items.

The terminology used herein is for the purposes of describing particular examples and embodiments only, and is not intended to be limiting. As used herein, the singular forms "a," "an," and "the" may be intended to include the plural forms as well, unless the context clearly indicates otherwise. It will be further understood that the terms "include," and/or "comprise," when used in this disclosure, specify the presence of integers, devices, behaviors, stated features, steps, elements, operations, and/or components, but do not exclude the presence or addition of one or more other integers, devices, behaviors, features, steps, elements, operations, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

An aspect of the present disclosure relates to a magnetic resonance imaging (MRI) coil device. The device may include a lower receiver coil portion, an upper receiver coil portion, and a locking mechanism. The upper receiver coil portion and the lower receiver coil portion may be moveable relative to each other. The upper receiver coil portion may fit with the lower receiver coil portion to provide a receiver coil assembly. The locking mechanism may be configured to lock the upper receiver coil portion and the lower receiver coil portion by limiting (e.g., prohibiting) relative movement between them when they are fit together. Under such a design, when being locked by the locking mechanism, the upper receiver coil portion may not move relative to the lower receiver coil portion so as to provide a stable device for scanning. When being released from the locking mechanism, the upper receiver coil portion may move relative to the lower receiver coil portion to provide more space for housing a patient to be scanned. A periscope may be positioned at a location of a window on the upper receiver coil portion. The periscope may be used for observation and alleviating discomfort of the patient when the patient is being scanned using the MRI coil device. One or more connectors (e.g., a male connector end, a female connector end) may be installed on the MRI coil device for providing electrical ports multiplexing between the upper receiver coil portion and the lower receiver coil portion. Under such a design, the one or more connectors may be used more efficiently, fewer connectors and/or corresponding cables may need to be employed in the MRI coil device.

Another aspect of the present disclosure relates to the locking mechanism. The locking mechanism may include a locking assembly and an adjusting assembly. The locking assembly may be mechanically connected (or simply connected for brevity) to a first coil structure that includes a first receiver coil portion (e.g., the lower receiver coil portion). The adjusting assembly may be connected to a second coil structure that includes a second receiver coil portion (e.g., the upper receiver coil portion). The locking mechanism may be configured to work in a locking mode or an unlocking mode. When the locking mechanism works in the locking mode, the adjusting assembly may be locked by the locking assembly and relative movement between the first coil structure and the second coil structure may be limited (e.g., prohibited) by the locking mechanism. The locking mechanism may include a knob connected to an adjusting rod of the adjusting assembly. By rotating the knob, the adjusting rod may be driven to move and/or rotate until being locked by the locking assembly.

FIG. 1 is a schematic diagram illustrating an exemplary MRI system 1000 according to some embodiments of the present disclosure. As illustrated, the MRI system 1000 may include a coil assembly 10, a couch 400, a processor 800, and a terminal device 900.

The couch 400 may be configured to support a subject to be scanned by the MRI system 1000. The subject may include a biological subject (e.g., a human, an animal), a non-biological subject (e.g., a phantom), etc. In some embodiments, a coil assembly (e.g., the coil assembly 10) may be positioned at an end of the couch 400.

The coil assembly 10 may be configured to broadcast RF signals to the subject and/or receive echo signals corresponding to the RF signals. The coil assembly 10 may include a body coil, a head coil, a shoulder coil, a neck coil, a knee coil, or the like, or any combination thereof. The coil assembly 10 may include a transmit-only RF coil, a receive-only RF coil, and/or a receive-transmit RF coil. The coil assembly 10 may include one or more components. Each of the one or more components may perform the same or different functions (e.g., transmitting RF signals, receiving returned signals). For example, the coil assembly 10 may include a first component, a second component, and a third component. The first component may be configured to transmit RF signals. The second component and the third component may both be configured to receive echo signals. As another example, the coil assembly 10 may include a first component and a second component. The first component may be configured to transmit RF signals. The second component may be configured to receive echo signals.

As illustrated in FIG. 1, the coil assembly 10 may include a first coil structure 200 and the second coil structure 300. At least part of the first coil structure 200 may be enclosed by the second coil structure 300. In some embodiments, the first coil structure 200 may be moveable relative to the second coil structure 300.

Figure 3:
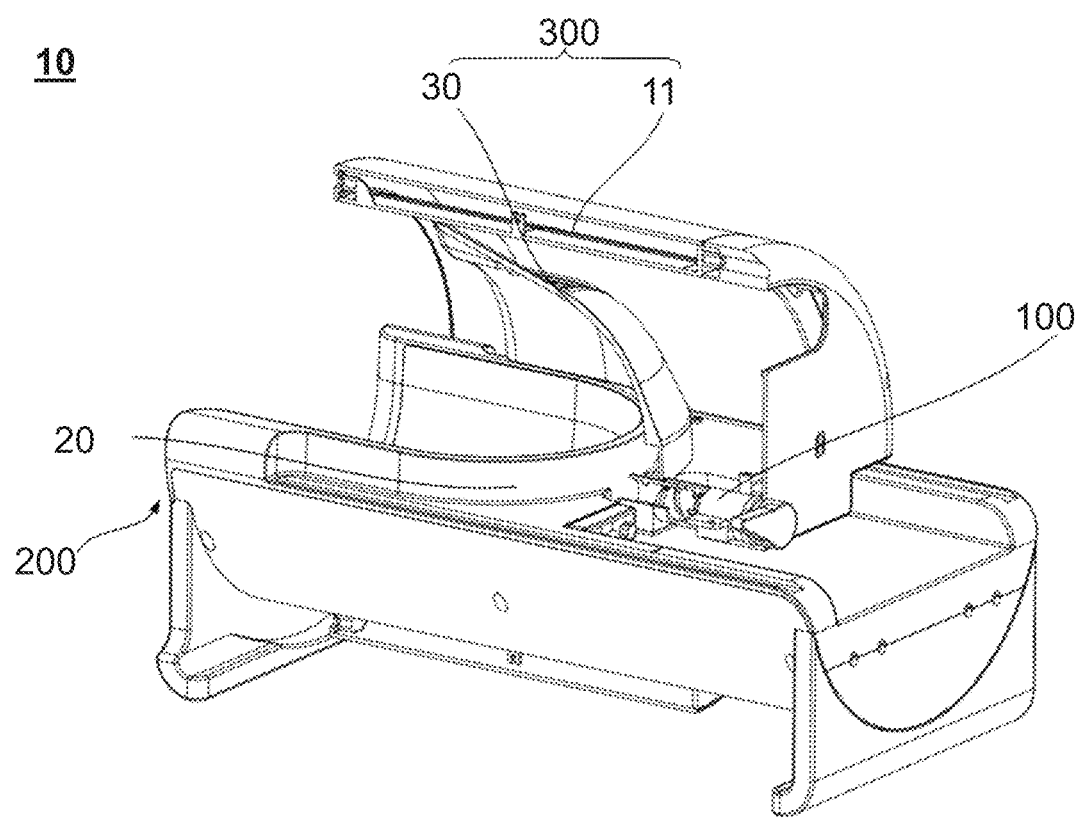
FIG. 3 is a schematic diagram illustrating an exemplary coil assembly according to some embodiments of the present disclosure.

In some embodiments, the first coil structure 200 may include a lower receiver coil portion 20 (shown in FIG. 3). The second coil structure 300 may include a transmitter coil assembly 11 and an upper receiver coil portion 30 (shown in FIG. 3). In other words, the second coil structure 300 may be a combination of the transmitter coil assembly 11 and the upper receiver coil portion 30. In some embodiments, the transmitter coil assembly 11 may include two coils be arranged opposite to each other. The two coils may both be designed in a shape of a cylindric structure. One coil of the two coils may be arranged in an inner side of the transmitter coil assembly 11. The other coil of the two coils may be arranged on outside of the transmitter coil assembly 11. The two coils may be synchronously driven to work (e.g., transmit RF signals, or receive echo signals) under a driven circuit. In some embodiments, the driven circuit may be positioned in the lower receiver coil portion 20.

The processor 800 may be operably connected to the coil assembly 10. The processor 800 may be configured to process the echo signals collected by the coil assembly 10. The echo signals may also be referred to MR signals or returned signals. Based on the echo signals, images corresponding to the object may be constructed by an imaging processing processor (e.g., the processor 800, a processor included in the terminal 900).

The terminal 900 may be operably connected to the processor 800. The terminal 900 may be configured to receive input and/or display output. The terminal 900 may include, for example, a display, a mobile device (e.g., a smartphone, a tablet, a laptop computer, or the like), a personal computer, other devices, or the like, or a combination thereof. Other devices may include a device that works independently to the imaging system, and a processing unit or processing module assembled thereupon (e.g., an intelligent home terminal).

In some embodiments, data transmission among the coil assembly 10, the processor 800, and the terminal 900 may be performed based on a network. The network may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, witches, server computers, and/or any combination there.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the MRI system 1000 may further include a storage for storing the echo signals collected by the coil assembly 10.

Figure 2:
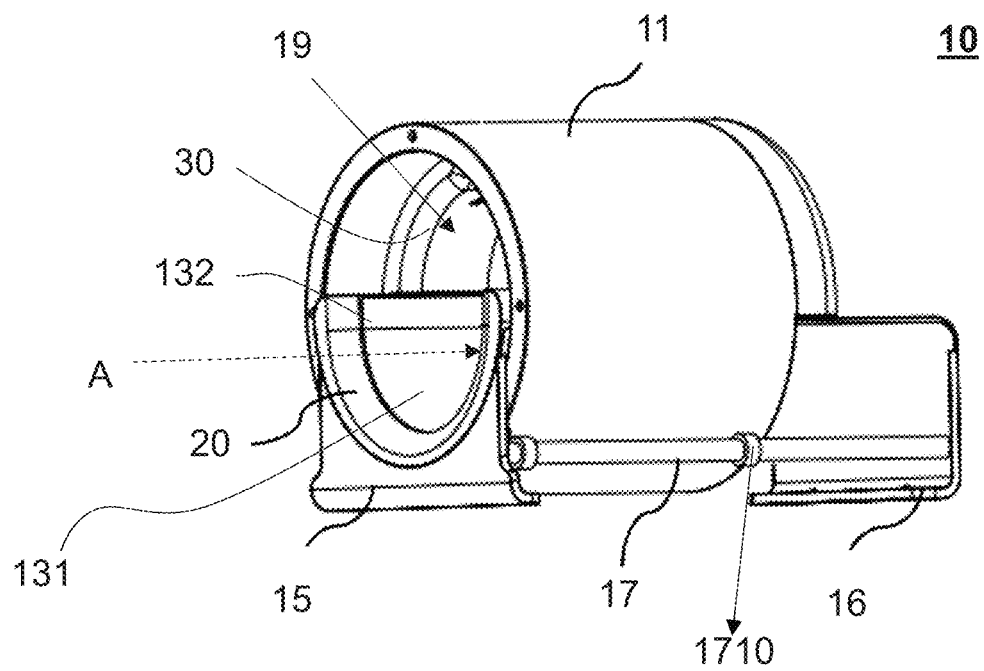
FIG. 2 is a schematic diagram illustrating an exemplary coil assembly according to some embodiments of the present disclosure.

FIG. 2 is a schematic diagram illustrating an exemplary coil assembly 10 according to some embodiments of the present disclosure. As shown in FIG. 2, the coil assembly 10 may include a transmitter coil assembly 11, an upper receiver coil portion 30, and a lower receiver coil portion 20. The upper receiver coil portion 30 may be moveable relative to the lower receiver coil portion 20. The upper receiver coil portion 30 and the lower receiver coil portion 20 may fit with each other to provide a receiver coil assembly. The receiver coil assembly may also be referred to as an unbroken receiver coil.

Figure 9:
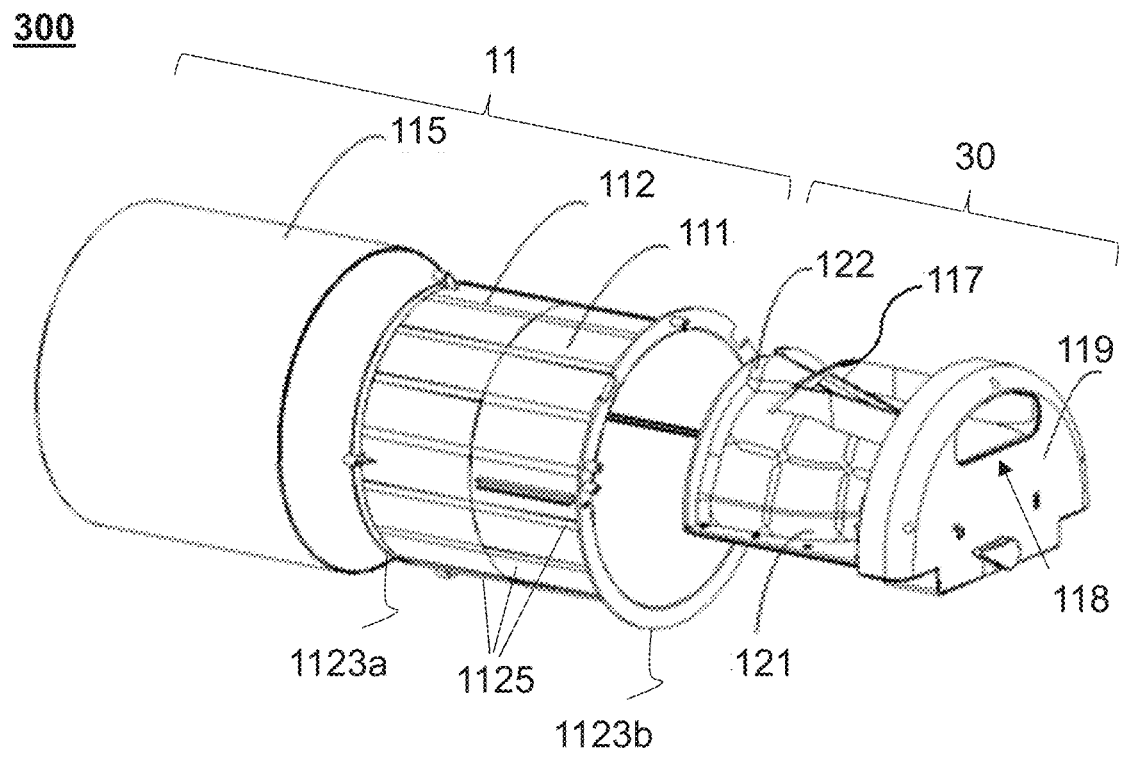
FIG. 9 is a schematic diagram illustrating an exploded view of an exemplary second coil structure according to some embodiments of the present disclosure.

The transmitter coil assembly 11 may be configured to transmit radio frequency (RF) signals. The transmitter coil assembly 11 may define a cavity 19. As used herein, the cavity 19 may include interior space determined by the transmitter coil assembly 11. Specifically, the cavity 19 may be defined based on the first shell 111 as shown in FIG. 9. In some embodiments, the transmitter coil assembly 11 may be driven to generate a radio frequency field (denoted B1) in the cavity 19. The B1 field may be a radio frequency field which is applied perpendicular to a main magnetic field (denoted B0 field) of an MRI device.

Figure 10:
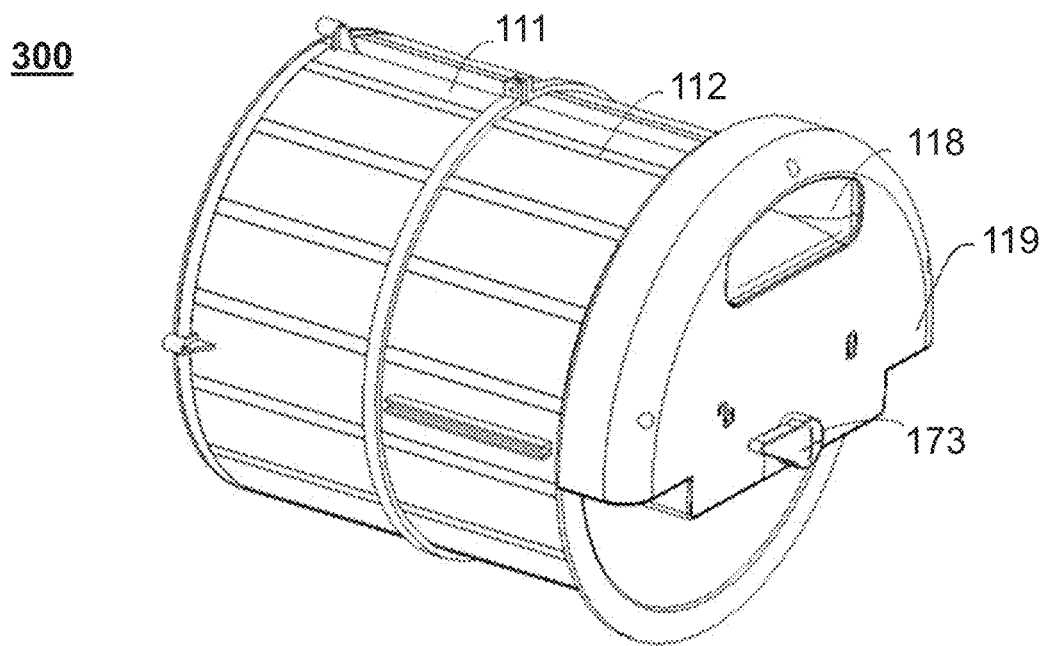
FIG. 10 is a schematic diagram illustrating an exemplary second coil structure according to some embodiments of the present disclosure.

In some embodiments, the transmitter coil assembly 11 may include one or more components, e.g., a transmitter coil (e.g., the transmitter coil 112 as illustrated in FIGS. 9 and 10) for sending the RF signals, a shell (e.g., the first shell 111, the shielding shell 115 as illustrated in FIG. 9), or the like, or any combination thereof. More details regarding the one or more components may be found elsewhere in the present disclosure. See, e.g., the description in connection with the transmitter coil assembly 11 in FIGS. 8, 9, 10, and 11.

The upper receiver coil portion 30 may be located in an upper portion of the cavity 19 through a fixing mechanism. The fixing mechanism may include removable or permanent connecting the upper receiver coil portion 30 to one or more components of the transmitter coil assembly 11. As used herein, if a component A connects to a component B by a permanent connection, the component A and the component B can only be separated by destroying at least a portion of the component A or the component B or a connector between the component A and the component B. Exemplary permanent connection may include welded connection, riveted connection, bond connection, or the like, or any combination thereof. As used herein, if a component C connects to a component D by a removable connection, the component C and the component D can be separated without destroying any connector between components C and D and any parts of the components C or D. Exemplary removable connection may include screw connection, bolt connection, lock connection, plug-in connection, or the like, or any combination thereof.

In some embodiments, the upper receiver coil portion 30 may be configured to receive echo signals corresponding to the RF signals. More details regarding the upper receiver coil portion 30 may be found elsewhere in the present disclosure. See, e.g., FIGS. 8 and 9 and the description thereof.

Figure 4:
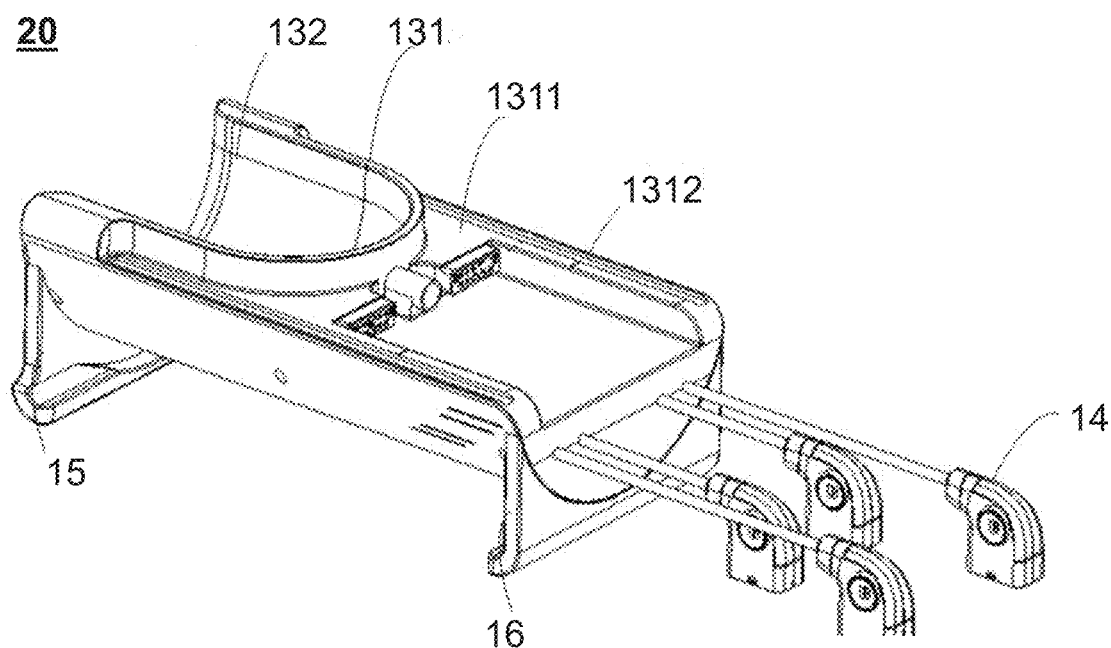
FIG. 4 is a schematic diagram illustrating an exemplary lower receiver coil portion according to some embodiments of the present disclosure.

The lower receiver coil portion 20 may be slidable engaged with the transmitter coil assembly 11. In other words, the lower receiver coil portion 20 may move relative to the transmitter coil assembly 11 along a slidable rail (e.g., the rail 1312 as illustrated in FIG. 4). In some embodiments, the lower receiver coil portion 20 may also be configured to support the transmitter coil assembly 11 or at least a portion of an object (e.g., a head of a patient) to be scanned by the MRI system 1000. The lower receiver coil portion 20 may move relative to the transmitter coil assembly 11 so that the lower receiver coil portion 20 may be moved in and out of a lower part of the cavity 19. In some embodiments, the lower receiver coil portion 20 may move relative to the transmitter coil assembly 11 along an axial direction of the transmitter coil assembly 11 (e.g., the direction A in FIG. 2). For example, a slidable rail (e.g., the rail 1312 as illustrated in FIG. 4) may be installed in the coil assembly 10 along the direction A. The lower receiver coil portion 20 and/or the transmitter coil assembly 11 may be moveable along the rail. As another example, a connecting structure 17 may be installed in the coil assembly 10 along the direction A. The transmitter coil assembly 11 may be moveable along the connecting structure 17.

Figure 6:
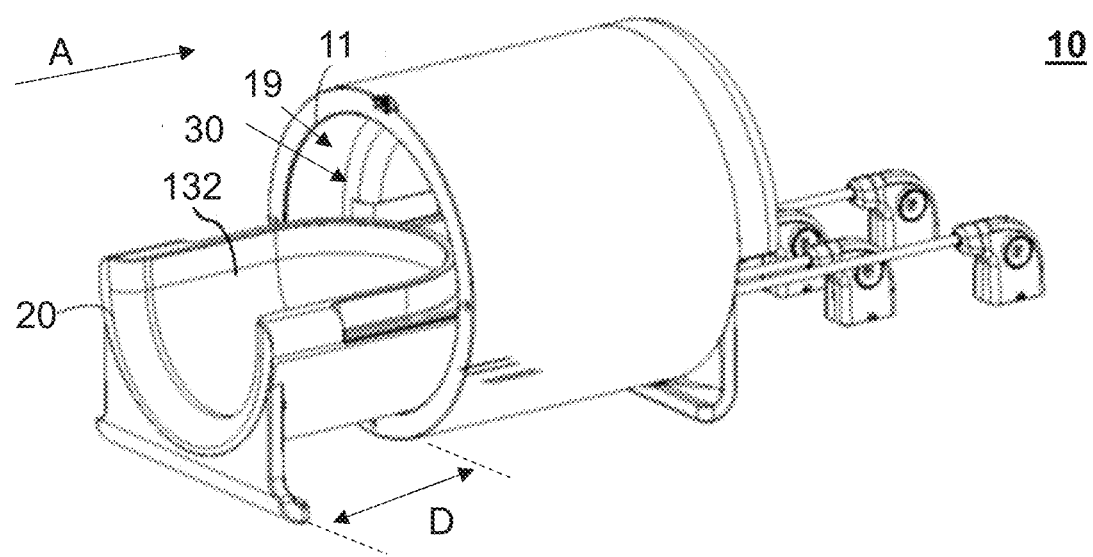
FIG. 6 is a schematic diagram illustrating an exemplary coil assembly according to some embodiments of the present disclosure.
Figure 7:
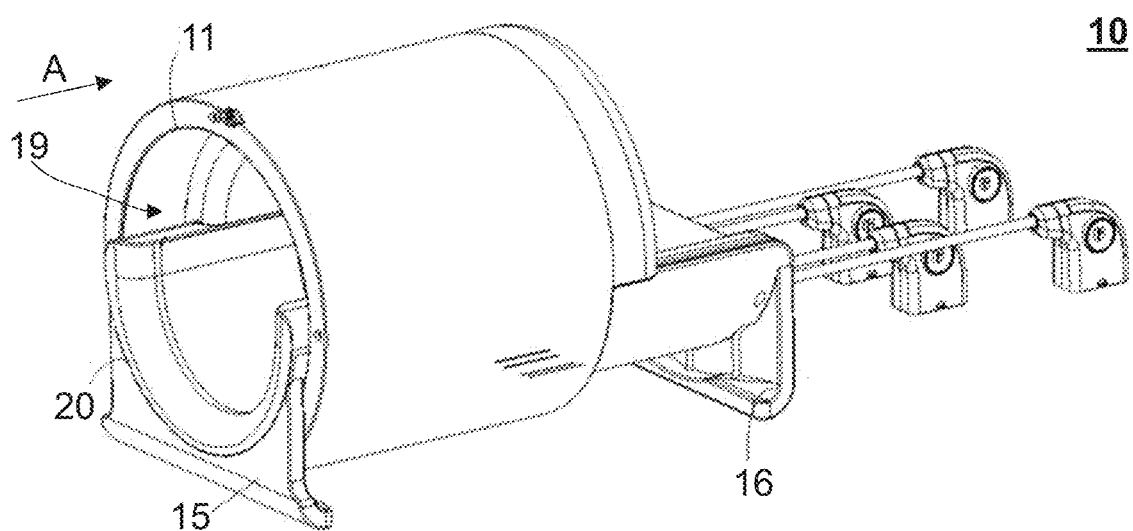
FIG. 7 is a schematic diagram illustrating an exemplary coil assembly according to some embodiments of the present disclosure.

In some embodiments, the relative position relationships between the lower receiver coil portion 20 and the transmitter coil assembly 11 may include: a) the receiver coil portion 13 is fully extended out of the transmitter coil assembly 11; b) at least part of the lower receiver coil portion 20 is enclosed by the transmitter coil assembly 11; and c) the receiver coil portion 13 is fully enclosed by the transmitter coil assembly 11. Exemplary relative position relationship c) between the lower receiver coil portion 20 and the transmitter coil assembly 11 may be found in FIG. 7. As shown in FIG. 7, the lower receiver coil portion 20 may be fully contained in the cavity 19. By moving the transmitter coil assembly 11 along the direction A with a distance D, the lower receiver coil portion 20 may be extended out of the cavity 19 with the distance D as shown in FIG. 6. If D is equal to the maximum distance of the transmitter coil assembly 11 may be moved, then FIG. 6 may illustrate the relative position relationship a) between the lower receiver coil portion 20 and the transmitter coil assembly 11.

In some embodiments, a rail (e.g., the rail 1312) may be employed for the slidably connection between the lower receiver coil portion 20 and the transmitter coil assembly 11. The movement of the transmitter coil assembly 11 along the direction A may be performed based on the rail. More details regarding the rail and its application in the slidably connection may be found elsewhere in the present disclosure. See, e.g., the description in connection with the rail 1312 in FIG. 4.

The upper receiver coil portion 30 and the lower receiver coil portion 20 may be configured to receive a plurality MR signals. The plurality of MR signals may be generated based on a plurality of RF signals (e.g., the RF signals generated by the transmitter coil assembly 11) transmitting an object. The plurality of MR signals may also be referred to as returned signals corresponding to the RF signals. In some embodiments, the RF signals may be generated by a transmitter coil included in the transmitter coil assembly 11. More details regarding the transmitter coil and its application in the transmitter coil assembly may be found elsewhere in the present disclosure. See, e.g., the description in connection with transmitter coil assembly 11 in FIGS. 8, 9, 10, and 11.

Each of the upper receiver coil portion 30 and the lower receiver coil portion 20 may include one or more receiver coils for receiving the MR signals. For example, the upper receiver coil portion 30 may include an upper receiver coil be configured to receive MR signals corresponding to an object in the front side (or face of the object). The lower receiver coil portion 20 may include a lower receiver coil be configured to receive MR signals corresponding to the object in the back side (or back of the head).

In some embodiments, the upper receiver coil portion 30 and the lower receiver coil portion 20 may both be employed to receive the MR signals. For example, the upper receiver coil portion 30 and the lower receiver coil portion 20 may be driven by the same driving circuit for receiving the MR signals. As another example, the upper receiver coil portion 30 and the lower receiver coil portion 20 may be droved by different driving circuits separately but worked simultaneously for receiving the MR signals.

In some embodiments, only one of the upper receiver coil portion 30 or the lower receiver coil portion 20 may be employed to receive the MR signals. For example, the upper receiver coil portion 30 may be configured with an assembly configuration and an un-assembly configuration. Under the un-assembly configuration, the upper receiver coil portion 30 may be disconnected from the transmitter coil assembly 11. The lower receiver coil portion 20 may be employed as the only one portion for receiving the MR signals. Under the assembly configuration, the upper receiver coil portion 30 may be affixed to the transmitter coil assembly 11. The lower receiver coil portion 20 may be contained in the cavity 19 or located on the couch 400. Under the assembly configuration, both of the two coil portions (including the upper receiver coil portion 30 and the lower receiver coil portion 20) may be employed to receive the MR signals. In such a situation, whether one or both coil portions are employed to receive MR signals may depend on the setting of the lower receiver coil portion 20. For example, if the lower receiver coil portion 20 is contained in the cavity 19, the upper receiver coil portion 30 and the lower receiver coil portion 20 may both be employed to receive the MR signals. If the lower receiver coil portion 20 is not contained in the cavity (e.g., located on the couch 400 instead), then the upper receiver coil portion 30 may be employed as the only one portion for receiving the MR signals.

Figure 5:
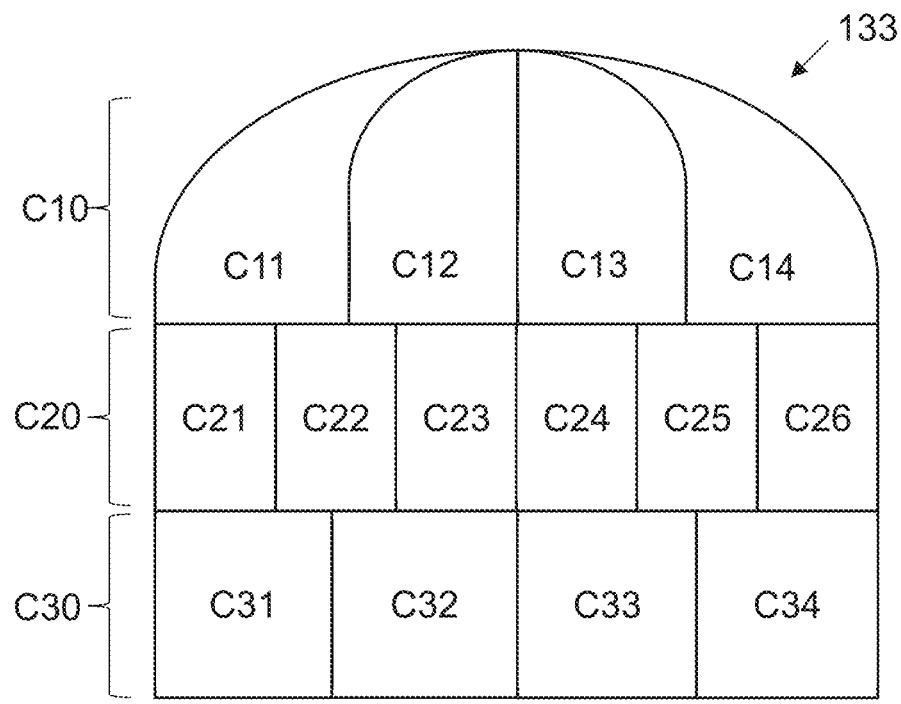
FIG. 5 is a schematic diagram illustrating an exemplary first receiver coil according to some embodiments of the present disclosure.

In some embodiments, the lower receiver coil portion 20 may include a second shell 131 and a first receiver coil 133 (e.g., as illustrated in FIGS. 4 and 5). The first receiver coil 133 may be carried by the second shell 131. For example, the first receiver coil 133 may be located in the second shell 131. As another example, the first receiver coil 133 may be located on a surface (e.g., an upper surface) of the second shell 131. In some embodiments, the first receiver coil 133 may be configured to receive MR signals corresponding to the back of a head of a patient. More details regarding the first receiver coil 133 may be found elsewhere in the present disclosure. See, e.g., the description in connection with the first receiver coil 133 in FIG. 5.

In some embodiments, at least a portion of an upper surface of the second shell 131 (shown in FIG. 4) may include a hollow surface area. The hollow surface area may define a container groove 132. The container groove 132 may extend along the axial direction (e.g., direction A) of the cavity 19 (also refer to the axial direction of the first shell 111 as shown in FIG. 9, the axial direction of the transmitter coil assembly 11 as shown in FIG. 9). At least a portion of the container groove 132 may include a curved shape (e.g., a shape of half-sphere) adapt to shapes of heads of human beings. The container groove 132 may be configured to support and contain at least a portion of an object (e.g., a head of a patient) to be scanned and located in the MRI system 1000.

In some embodiments, the at least portion of the object may touch with and be supported by the container groove 132 at a connection surface of the container groove 132. A horizontal section of the connection surface may define a line B (not shown in FIG. 2). The line B and a horizontal line may make an angle $\theta$ (not shown in FIG. 2). In some embodiments, the angle $\theta$ may be zero which means the line B parallels to the horizontal line. In some embodiments, the angle $\theta$ may be an acute angle (e.g., 0.2, 0.3, 0.5, 0.7, 1, 3, 5, 10, 15) which means the connection surface slopes up slightly along the horizontal surface. Under such a design, when a patient is positioned on a couch (e.g., the couch 400) and the head of the patient is supported by the container groove 132, a vertical height of the top of the head may be higher than a vertical height the neck of the patient. The vertical height difference may reduce a feeling of dizziness felt by the patient on the couch, especially when the patient needs to be positioned on the couch for a long time (e.g., 10 minutes, 15 minutes, 30 minutes). In some embodiments, the angle θ may be determined based on a vertical height difference of support structures of the second shell 131 (e.g., the first support structure 15 and second support structure 16). For example, the higher the second support structure 16 than the first support structure 15, the larger may be the angle θ. In some embodiments, the angle θ may be determined based on a thickness difference of two ends of the container groove 132. For example, an end of the container groove 132, which is near the top of the head of the patient, may be made with a more thickness structure than the opposite end of the container groove 132.

In some embodiments, the lower receiver coil portion 20 may further include a first support structure 15 and a second support structure 16. The first support structure 15 may be positioned at a first end of the second shell 131 for supporting the coil assembly 10. The second support structure 16 may be positioned a second end of the second shell 131 for supporting the coil assembly 10. The transmitter coil assembly 11 may be configured to bear the upper receiver coil portion 30 and enable a movement of the upper receiver coil portion 30 along the direction A between the first support structure 15 and second support structure 16. In some embodiments, the first end of the second shell 131 may be an end located in an opened end of the coil assembly 10 for providing the at least portion of the object to move in and out of the coil assembly 10. The second end of the second shell 131 may be an opposite end to the first end of the second shell 131. In some embodiments, a channel (e.g., the channel 118 as illustrated in FIG. 9) for observation may be located at the second end of the second shell 131.

In some embodiment, vertical heights of the first support structure 15 and second support structure 16 may be the same or different. For example, the vertical height of the first support structure 15 may be lower than the vertical height of the second support structure 16 so that the container groove 132 may be tilted with a lower opened end (e.g., the first end of the second shell 131). When a head of a patient is located in the container groove 132, feelings of uncomfortable (e.g., dizziness) may be reduced.

In some embodiments, a connecting structure 17 may be positioned between the first support structure 15 and the second support structure 16. For instance, the connecting structure 17 may be in the form of a connecting rod. The connecting structure 17 may be configured to support the transmitter coil assembly 11. For example, the transmitter coil assembly 11 may include a through hole 1710 formed in a substrate, which protrudes from at least one side (e.g., the left and/or right side(s)) of a shell (e.g., the shielding shell 115 as shown in FIG. 9) of the transmitter coil assembly 11. The connecting structure 17 may pass through the through hole 1710. The first end of the connecting structure 17 may be fixed with the first support structure 15. A second end of the connecting structure 17, which is opposite to the first end, may be fixed with the second support structure 16. The connecting structure 17 may include a connecting rod with any cross-section shape (e.g., round, triangle, square, or the like). In some embodiments, the transmitter coil assembly 11 may slide along the connecting structure 17. Not limited to the left and/or right side(s) of the shell, the through hole 1710 may be located in any position surrounding the shell. For example, the through hole 1710 may be also be located in a bottom side of the shell of the transmitter coil assembly 11.

It should be noted that a count of the through hole 1710 and corresponding connecting structure 17 included in the coil assembly 10 may be any positive integer. In some embodiments, more than one connecting structure 17 may be used in the coil assembly 10. For example, two connecting structures 17 may be located at two sides of the coil assembly 10. As another example, three connecting structures 17 may be employed by the coil assembly 10, two of which be located at the left side of the coil assembly 10 and one be located at the right side of the coil assembly 10. In some embodiments, each of the connecting structure 17 may pass through more than one through holes. For example, three through holes may be arranged in line for guiding and supporting the same connecting structure. As another example, two through holes may be employed for the same connecting structure.

By employing two supporting structures (e.g., the first support structure 15 and second support structure 16) instead of the couch 400 to support the lower receiver coil portion 20, a distance may exist between a top surface the couch 400 and a bottom side of the lower receiver coil portion 20. The transmitter coil assembly 11 may move along the axial direction of the cavity 19 and enclose the lower receiver coil portion 20. Under such a design, the lower receiver coil portion 20 may be separated with the transmitter coil assembly 11. That is to say, the transmitter coil assembly 11 may be moved without moving the lower receiver coil portion 20. Then a total weight needed to be moved in moving the transmitter coil assembly 11 may be reduced by excluding the moving of the lower receiver coil portion 20. In some embodiments, the movable distance of the transmitter coil assembly 11 may be limited by the two supporting structures. For example, a maximum moving distance of the transmitter coil assembly 11 may be no longer than a distance between the two supporting structures (or a length of the connecting structure 17). Based on the distance limitation of the two supporting structures, falling of the transmitter coil assembly 11 caused by over pushing/pulling may be avoided. By using the two supporting structures to support the transmitter coil assembly 11 and the lower receiver coil portion 20, the design complexity of the coil assembly 10 may be reduced. For example, no more slide structure may be employed in the cavity 19 for supporting the slide connection between the lower receiver coil portion 13 and the transmitter coil assembly 11.

FIG. 3 is a schematic diagram illustrating an exemplary coil assembly 10 according to some embodiments of the present disclosure. As shown in FIG. 3, the coil assembly 10 may include the first coil structure 200 and the second coil structure 300. The first coil structure 200 may include the lower receiver coil portion 20. The second coil structure 300 may include the transmitter coil assembly 11 and the upper receiver coil portion 30.

In some embodiments, the coil assembly 10 may further include a locking mechanism (or referred to as a locking structure) 100. The locking mechanism 100 may be configured to lock or unlock the first coil structure 200 and the second coil structure 300. In other words, the locking mechanism 100 may be configured to control the coil assembly 10 switches between a locking mode or an unlocking mode. If the coil assembly 10 is in the locking mode, the locking mechanism 100 is in a locking configuration and the first coil structure 200 may fit together with the second coil structure 300. That is to say, the second coil structure 300 can not move relative to the first coil structure 200. If the coil assembly 10 is in the unlocking mode, the locking mechanism 100 is in an unlocking configuration and the second coil structure 300 can move relative to the first coil structure 200. More details regarding the locking mechanism 100 and its application may be found elsewhere in the present disclosure. See, e.g., the description in connection with the locking mechanism 100 in FIGS. 18-31.

It should be noted, an MRI system, especially MRI system for head scanning, generally includes an upper portion and a lower portion combined to perform the head scanning. In some embodiments, the upper portion and the lower portion may move relative to each other. Exemplary MRI system including the moveable upper portion and lower portion may include the first coil structure 200 and the second coil structure 300. If the moveable upper portion and lower portion are not be fixed relative to each other, then vibrations generated in using the MRI system may lead to a mismatch between the upper portion and lower portion which may influence the accuracy of an MRI image. The locking mechanism 100 included in the coil assembly 10 may be configured to avoid the above-mentioned mismatch when they are fitting together and enhance the accuracy of the MRI image.

FIG. 4 is a schematic diagram illustrating an exemplary lower receiver coil portion 20 according to some embodiments of the present disclosure. As shown in FIG. 4, the lower receiver coil portion 20 may include a second shell 131 associated with the container groove 132, the first receiver coil 133 (not shown in FIG. 4), the first support structure 15, and the second support structure 16. The lower receiver coil portion 20 may be connected to one or more plugs 14.

In some embodiments, one or more plugs 14 may be positioned at an end of the second shell 131. The one or more plugs 14 may be connected to one or more components of the coil assembly 10 through one or more cables. The one or more cables may be configured to provide power, transmit data, or the like. The one or more cables for electrical connecting a component of the coil assembly 10 with a plug may be positioned anywhere.

It should be noted, the present disclosure is not intended to limit the position of cables electrical connecting to the one or more plugs 14. In some embodiments, the cables may be positioned in other locations. For example, cables for electrical connecting the upper receiver coil portion 30 with the one or more plugs 14 may be positioned in an upper part of the coil assembly 10. As another example, cables for electrical connecting the lower receiver coil portion 20 with the one or more plugs 14 may be positioned in a lower part of the coil assembly 10. As a further example, cables for electrical connecting the transmitter coil assembly 11 with the one or more plugs 14 may be positioned in the upper part, the lower part, the left side, or the right side of the coil assembly 10, or any combination thereof.

In some embodiments, the cables corresponding to the one or more plugs 14 may not be necessary. For example, the cables may be omitted. Instead of using the cables, an electrical interface may be employed by the lower receiver coil portion 20 and/or other components (e.g., the transmitter coil assembly 11) of the coil assembly 10. In such a situation, a corresponding electrical interface may be installed on the couch 400 for matching with the electrical interface of the lower receiver coil portion 20 and/or other components of the coil assembly 10.

In some embodiments, the first shell 111 (as shown in FIG. 9) or the upper receiver coil portion 30 may include a male connector end (not shown). The second shell 131 may include a female connector end 1311. The female connector end 1311 may be complementary to the male connector end to determine a complete connector when the transmitter coil assembly 11 to move to a particular position along the direction A. In some embodiments, the female connector end 1311 may be installed on the first shell 111 (as shown in FIG. 9) or the upper receiver coil portion 30 and the male connector end may be installed on the second shell 131.

In some embodiments, one or more injectors (e.g., RF injector, DC (direct current) injector, infrared injector, etc.) may be set in the male connector end (not shown) and/or the female connector end 1311. The one or more injectors may be configured to drive the transmitter coil 112 to make the first receiver coil 133 in lower receiver coil portion 20 and the second receiver coil 122 in the upper receiver coil portion 30 being resonant and/or detuning.

For example, when the transmitter coil assembly 11 moves to the particular position (e.g., a position of the transmitter coil assembly 11 corresponding to the lower receiver coil portion 20 fits with the upper receiver coil portion 30) an electrical connection may be established based on the combined connector including the male connector end (not shown) and female connector end 1311. Based on the electrical connection, the transmitter coil assembly 11 may be electrically connected to one or more external cables which may lead to one or more electrical components in the upper receiver coil portion 30 and/or the lower receiver coil portion 20 be electrically connected to the one or more external cables. When the transmitter coil assembly 11 have not moved to the particular position (e.g., the lower receiver coil portion 20 being physically separate from the upper receiver coil portion 30) the male connector end (not shown) may be disconnected from the female connector end 1311, and only the lower receiver coil portion 20 may be electrically connected to the one or more external cables. In such a situation, the transmitter coil assembly 11 and upper receiver coil portion 30 may be electrically disconnected from an external power source.

Base on the combined connector (e.g., the combination of the male connector end (not shown) and female connector end 1311), electrically ports multiplexing between the upper receiver coil portion 30 and the lower receiver coil portion 20 may be achieved. At the same time, cables corresponding to the one or more plugs 14 may be positioned in the lower receiver coil portion 20. With such a design, the count of cables needed to be used may be reduced. The transmitter coil assembly 11, the upper receiver coil portion 30, and the lower receiver coil portion 20 may be operably connected to external devices through the cables and the combined connector. By placing the cables in the lower receiver coil portion 20, which may be positioned in a resting position, moving and blending of the cables may be reduced which may lead to the cables lasting longer.

In some embodiments, the lower receiver coil portion 20 may further include a rail 1312. The upper receiver coil portion 30 may be connected, via a slide connection, to the lower receiver coil portion 20 (e.g., the second shell 131) through the rail 1312. By sliding along the rail 1312, the upper receiver coil portion 30 (or the transmitter coil assembly 11, the second coil structure 300) may move far away from the lower receiver coil portion 20 and provide more space for a patient to move (e.g., raise the patient's head).

After the patient is positioned on the couch 400 with a proper and comfortable head gesture, the upper receiver coil portion 30 (or the transmitter coil assembly 11, the second coil structure 300) may move back along the rail 1312 to match with the lower receiver coil portion 20. In some embodiments, the rail 1312 may bear the upper receiver coil portion 30 and jointly support the transmitter coil assembly 11 with the connecting structure 17 (shown in FIG. 2). In some embodiments, the rail 1312 may only guide the movement of the upper receiver coil portion 30 without bearing the upper receiver coil portion 30.

In some embodiments, the upper receiver coil portion 30 may be supported by an upper support structure 121 (as illustrated in FIG. 9). The lower receiver coil portion 20 may be supported by the second shell 131. Any structure which can provide slidably connection between the upper support structure 121 and the second shell 131 may be employed by the present disclosure. For example, slide blocks (not shown) may be arranged on two sides of the upper support structure 121. The rail 1312 may be arranged on each side of the second shell 131. The rail 1312 may be configured to engage with the slide blocks for guiding the slide blocks slide along the rail 1312. Base on the rail 1312 and the slide blocks, the upper receiver coil portion 30 may move relative to the lower receiver coil portion 20. Then the transmitter coil assembly 11, which is fixed connected to the upper receiver coil portion 30, may move relative to the lower receiver coil portion 20 along the axial direction of the cavity 19.

By sliding the upper receiver coil portion 30 relative to the lower receiver coil portion 20, the upper receiver coil portion 30 may fit with the lower receiver coil portion 20 or separate with the lower receiver coil portion 20. As shown in FIG. 7, by moving the upper receiver coil portion 30 to a first position, the upper receiver coil portion 30 may fit with the lower receiver coil portion 20. As shown in FIG. 6, by moving the upper receiver coil portion 30 to a second position, the upper receiver coil portion 30 may separate with the lower receiver coil portion 20.

FIG. 5 is a schematic diagram illustrating an exemplary first receiver coil 133 according to some embodiments of the present disclosure. The first receiver coil 133 may include one or more coil segments. As shown in FIG. 5, the first receiver coil 133 may include a first coil segment C10, a second coil segment C20, and a third coil segment C30. The first coil segment C10, the second coil segment C20, and the third coil segment C30 may be arranged along an axial direction of the container groove 132.

Each of the one or more coil segments of the first receiver coil 133 may include one or more coil elements. In some embodiments, a count of coil elements included in a coil segment may be no less than 2, 4, 5, 7, 8, 10, 12, 15, 20, 30, 50, or the like. In some embodiments, counts of coil elements included in any two coil segments of the first receiver coil 133 may be the same or different. As shown in FIG. 5, the first coil segment C10 may include four coil elements C11, C12, C13, and C14. The second coil segment C20, located between the first coil segment C10 and the third coil segment C30, may include six coil elements C21, C22, C23, C24, C25, and C26. The third coil segment C30 may include four coil elements C31, C32, C33, and C34.

In some embodiments, each of the one or more coil elements may define a closed-loop for receiving MRI signal. The coil element may be made of any conductive material, such as, copper braid, copper wire, coaxial cable, or the like, or any combination thereof. The coil element may employ any shape design, such as saddle coil, spiral coil, single loop, cylindrical coil, or the like. Exemplary first receiver coil 133 may employ a phased array that include a plurality of coil elements.

FIG. 6 is a schematic diagram illustrating an exemplary coil assembly 10 according to some embodiments of the present disclosure. As shown in FIG. 6, the lower receiver coil portion 20 may be partially contained in the cavity 19. The lower receiver coil portion 20 may be separate from the upper receiver coil portion 30 which is fixed connecting to the transmitter coil assembly 11. The container groove 132 may extend out of the transmitter coil assembly 11 with a distance D, then a head of the patient positioned in the container groove 132 may have more movement space. Direction A may be an axial direction of the cavity 19. In some embodiments, the extension distance D of the container groove 132 relatives to the transmitter coil assembly 11 may be performed by moving the transmitter coil assembly 11 along the direction A with the distance D.

FIG. 7 is a schematic diagram illustrating an exemplary coil assembly 10 according to some embodiments of the present disclosure. As shown in FIG. 7, the lower receiver coil portion 20 may be fully contained in the cavity 19. The lower receiver coil portion 20 may be supported by the first support structure 15 and second support structure 16. By moving the transmitter coil assembly 11 backward along the direction A with a distance D, the transmitter coil assembly 11 may be changed from a first status as shown in FIG. 6 to a second status as shown in FIG. 7. By moving the transmitter coil assembly 11 forward along the direction A with the distance D, the transmitter coil assembly 11 may be changed from the second status as shown in FIG. 7 to the first status as shown in FIG. 6.

Figure 8:
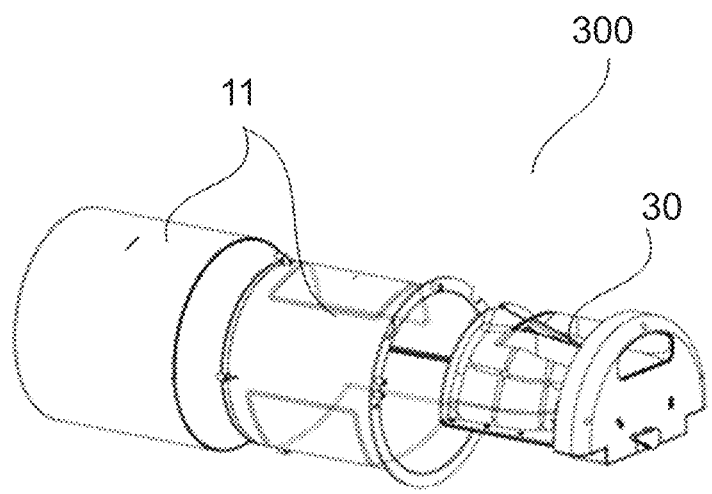
FIG. 8 is a schematic diagram illustrating an exploded view of an exemplary second coil structure according to some embodiments of the present disclosure.

FIG. 8 is a schematic diagram illustrating an exploded view of an exemplary second coil structure 300 according to some embodiments of the present disclosure. As shown in FIG. 8, the second coil structure 300 may include the transmitter coil assembly 11 and the upper receiver coil portion 30. More details regarding the second coil structure 300 may be found elsewhere in the present disclosure. See, e.g., the description in connection with the second coil structure 300 in FIG. 9.

FIG. 9 is a schematic diagram illustrating an exploded view of an exemplary second coil structure according to some embodiments of the present disclosure. As shown in FIG. 9, the second coil structure 300 may include the transmitter coil assembly 11 and the upper receiver coil portion 30.

As shown in FIG. 9, the transmitter coil assembly 11 may include a first shell 111, a transmitter coil 112, and a shielding shell 115. The first shell 111 may include a tube-shaped structure. A cross-section shape of the tube-shaped structure may include square, rectangle, hex, octagon, pentagon, triangle, flat oval, fluted, mailbox, or the like, or any combination thereof. The tube-shaped structure may include a first end and a second end. The first end of the tube-shaped structure (also refer to the first end of the first shell 111) may be opened. An object (e.g., a head of a patient) may be moved in and out of the tube-shaped structure through the opened end. The second end of the tube-shaped structure (also refer to the second end of the first shell 111) may include a partly closed structure with an opening. The opening may be configured to make at least a part of the lower receiver coil portion 20 to extend out of the first shell 111 when the lower receiver coil portion 20 is assembled with the transmitter coil assembly 11. As shown in FIG. 9, a top 119 may partly cover a cross-section of the first shell 111 and the opening may be defined based on the uncovered part of the cross-section of the first shell 111.

The transmitter coil 112 may be located in the first shell 111 or on a surface (e.g., an outer surface, or inner surface) of the first shell 111. The transmitter coil 112 may be arranged in a radial direction of the first shell 111 and define an interior space (e.g., the cavity 19). A plurality of RF signals generated by the transmitter coil 112 may be applied in the interior space.

In some embodiments, the transmitter coil 112 may be arranged on the outer surface of the tube-shaped structure of the first shell 111. For example, the transmitter coil 112 may be arranged in a particular pattern (e.g., even distribution) for generating a uniform RF field and providing reliability and stability of the RF filed generation. The transmitter coil assembly 11 may move along the axial direction of the cavity 19 so that at least a portion of the lower receiver coil portion 20 may be included in the cavity 19.

In some embodiments, the transmitter coil 112 may include a birdcage coil or a transmitter array coil. As shown in FIG. 9, the transmitter coil 112 may include two circular conductive loops referred to as two end rings 1123a and 1123b, and N conductive straight elements referred to as N multiple legs 1125. The multiple legs 1125 may be positioned between the two end rings 1123a and 1123b. Each of the multiple legs 1125 may extend from one end ring (e.g., the end ring 1123a) to the other end ring (e.g., the end ring 1123b). The multiple legs 1125 may be arranged side-by-side (e.g., in a parallel distribution) along the circumferential direction of the first shell 111. In some embodiments, the transmitter coil 112 may further include a plurality of capacitors on the N multiple legs 1125 or the two end rings 1123a and 1123b or both. According to the location of these capacitors on the coil geometry, there may be three types of birdcage coils: low-pass, high-pass and band-pass.

The shielding shell 115 may be configured to shield the transmitter coil 112. In some embodiments, the shielding shell 115 may include a tube-structure. The shielding shell 115 may be located outside the first shell 111. The first shell 111 may be enclosed by the shielding shell 115. One or more shielding layers may be set on an inner surface or in an inner wall of the shielding shell 115. The one or more shielding layers may be configured to shield the transmitter coil 112 to reduce power loss and/or influence to the MRI system.

As shown in FIG. 9, the upper receiver coil portion 30 may include an upper support structure 121, a second receiver coil 122, and a top 119. A periscope 117 may be located on the upper receiver coil portion 30. An end of channel 118 may be located on the top 119.

The upper receiver coil portion 30 may be fixed in an upper part of the cavity 19 (shown in FIG. 2) defined by the transmitter coil assembly 11. The upper receiver coil portion 30 may be moveable or non-moveable from the transmitter coil assembly 11 depending on a fixing mechanism between them. More details regarding the fixing mechanism may be found elsewhere in the present disclosure. See, e.g., the description in connection with the upper receiver coil portion 30 and the transmitter coil assembly 11 in FIG. 2.

In some embodiments, the upper receiver coil portion 30 may be fixed on an inner surface of the first shell 111. The transmitter coil 112 may be fixed on the outside surface of the first shell 111. By positioning the upper receiver coil portion 30 and the transmitter coil 112 on different surfaces of the first shell 111, the possibility and degree of work performance of a receiver coil (e.g., the upper receiver coil portion 30) influenced by heat generated by a working transmitter coil may be reduced. At the same time, setting the upper receiver coil portion 30 on the inner surface of the first shell 111 and setting the transmitter coil 112 on the outside surface of the first shell 111 can make the upper receiver coil portion 30 closer than the transmitter coil 112 to an object to be scanned (e.g., the head of the patient). In such a situation, receiver sensitivity (e.g., the sensitivity of the upper receiver coil portion 30) may be enhanced. Based on the fixed connection between the upper receiver coil portion 30 and the transmitter coil assembly 11 (e.g., the first shell 111 of the transmitter coil assembly 11), the upper receiver coil portion 30 may move with the transmitter coil assembly 11. When the object to be scanned is positioned in the lower receiver coil portion 20 (shown in FIG. 2), by moving the transmitter coil assembly 11 to a particular position, the upper receiver coil portion 30 may be moved to a corresponding position to combine with the lower receiver coil portion 20 to determine the unbroken receiver coil. The above-mentioned design of the transmitter coil assembly 11 and the two receiver coil portions (e.g., the upper receiver coil portion 30 and the lower receiver coil portion 20) can not only simplify structures, reduce weight, and cutdown size of assemblies in an MRI coil, but also can reduce operations and save time of a user for combining one or more components of the MRI coil (e.g., the upper receiver coil portion 30 and the lower receiver coil portion 20, and the transmitter coil assembly 11).

The upper support structure 121 may be fixed in an upper part of the cavity 19 (shown in FIG. 2). A window may be located at a position (e.g., the window position 116 shown in FIG. 12) on the upper support structure 121. The second receiver coil 122 may be located on a surface or in the upper support structure 121.

The second receiver coil 122 may be supported by the upper support structure 121. The second receiver coil 122 may include one or more components (e.g., coils) in an array arrangement. The arrangement of one or more components may be designed to consider the position of the window. For example, no coil may be located at the position of the window. As another example, each of the one or more components may be positioned with a particular distance (e.g., no less than 0.01 mm, 0.5 mm, 0.5 cm, 1 cm, 3 cm, 5 cm) from any edge of the window to enhance the fixedness of the upper receiver coil portion 30. In some embodiments, the second receiver coil 122 may be evenly arranged on a surface of the upper support structure 121 for sufficiently receiving the MR signals corresponding to the object to be scanned. According to the present disclosure, the second receiver coil 122 and the first receiver coil 133 are positioned separately in the upper part and the lower part of the cavity 19. Then MR signals corresponding to the face and back of the head may both be collected by the MRI system 1000 when performing a scan.

As shown in FIG. 9, the transmitter coil assembly 11 and the upper receiver coil portion 30 may be supported by different structures, then a distance between the transmitter coil assembly 11 and the upper receiver coil portion 30 may be increased. With the increased distance, even if the transmitter coil assembly 11 generates more heat when working, the influence to the sensitivity of the upper receiver coil portion 30 may also be reduced. Supporting by the upper support structure 121, the upper receiver coil portion 30 may be designed to be more adapt to surface of human beings which may also lead to high sensitivity of the upper receiver coil portion 30. Opening a window on the upper support structure 121 may avoid a situation of the upper support structure 121 being too close to a tissue of the patient to be scanned which may lead to a feeling of dizziness when performing a scan.

The top 119 may be located at the second end of the tube-shaped structure (also refer to the second end of the first shell 111). The top 119 may be configured to define the partly closed structure of the first shell 111.

Figure 12:
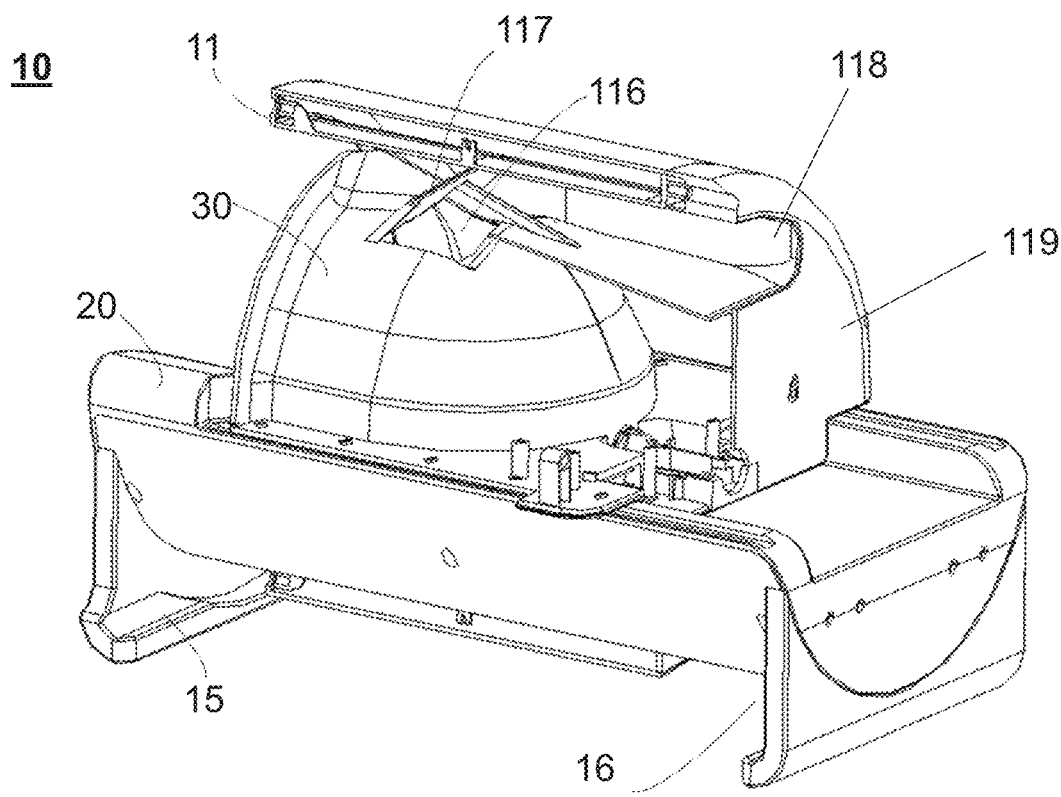
FIG. 12 is a schematic diagram illustrating an exemplary coil assembly according to some embodiments of the present disclosure.

In some embodiments, an end of channel 118 may be located on the top 119. The channel 118 may be configured for observation from a patient. The channel 118 may extend from the top (also refer to a surface of an end of the first shell 111) to a position in the second coil structure 300 (e.g., a window position 116 as shown in FIG. 12). The existence of the channel 118 may provide an optical channel from in inner space of the first shell to an outside space of the first shell 111 without opening any window (also refer as open any hole) on the first shell 111. The channel 118 is located on the top 119, so there's not need to dig window on the corresponding position of the shielding shell 115. The design of using the channel 118 instead of digging a window on the first shell 111 and/or the shielding shell 115 can not only provide a more uniform RF field but also can improve the shielding effect of the shielding shell 115.

FIG. 10 is a schematic diagram illustrating an exemplary second coil structure according to some embodiments of the present disclosure. As shown in FIG. 10, the top 119 may be connected to an end of the first shell 111 to form a partly closed end of the first shell 111. The transmitter coil 112 may be located on the first shell 111. An end of the channel 118 may be positioned on the top 119.

In some embodiments, the top may further include a knob 173 be configured to control the locking mechanism of the first coil structure 200 (as shown in FIG. 1) and the second coil structure 300. More details regarding the knob and its application in the locking mechanism may be found elsewhere in the present disclosure. See, e.g., the description in connection with the knob 173 and the locking mechanism 100 in FIGS. 4 and 18-31.

Figure 11:
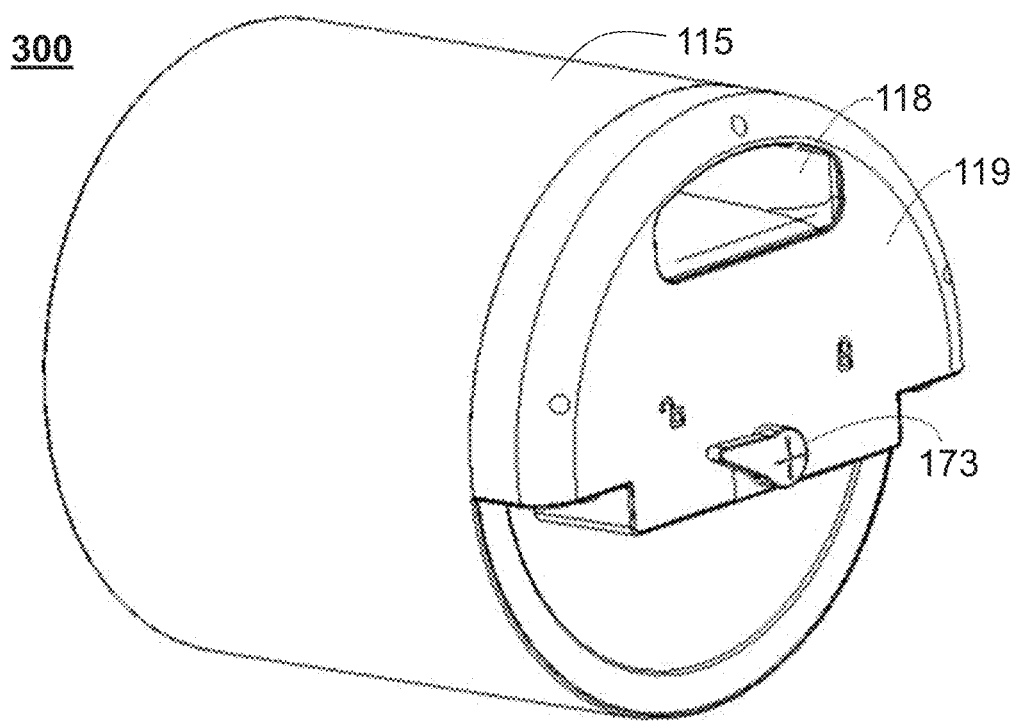
FIG. 11 is a schematic diagram illustrating an exemplary second coil structure according to some embodiments of the present disclosure.

FIG. 11 is a schematic diagram illustrating an exemplary second coil structure according to some embodiments of the present disclosure. As shown in FIG. 11, The second coil structure may include the shielding shell 115. The shielding shell 115 may enclose the first shell 111 (not shown in FIG. 11) and the transmitter coil 112 (not shown in FIG. 11). The top 119 may be located on one end of the shielding shell 115. The knob 173 and the channel may be located on the top 119.

FIG. 12 is a schematic diagram illustrating an exemplary coil assembly according to some embodiments of the present disclosure. As shown in FIG. 12, the coil assembly 10 may include the transmitter coil assembly 11, the upper receiver coil portion 30, the lower receiver coil portion 20, the first support structure 15, and the second support structure 16. An end of the channel 118 may be positioned on the top 119 and the other end of the channel 118 may be positioned on a location (e.g., the window position 116) in an interior space of the transmitter coil assembly 11. The periscope 117 may be located on the window position 116. The periscope 117 may be arranged in a particular angle with an extension direction of the channel 118. The angle may be any angle in a range of 0° to 90°. By using the periscope 117 and the channel 118, a patient may see something (e.g., a figure, a video, or anything outside the coil assembly 10) and be provided with some visual stimulations to reduce claustrophobia.

Figure 13:
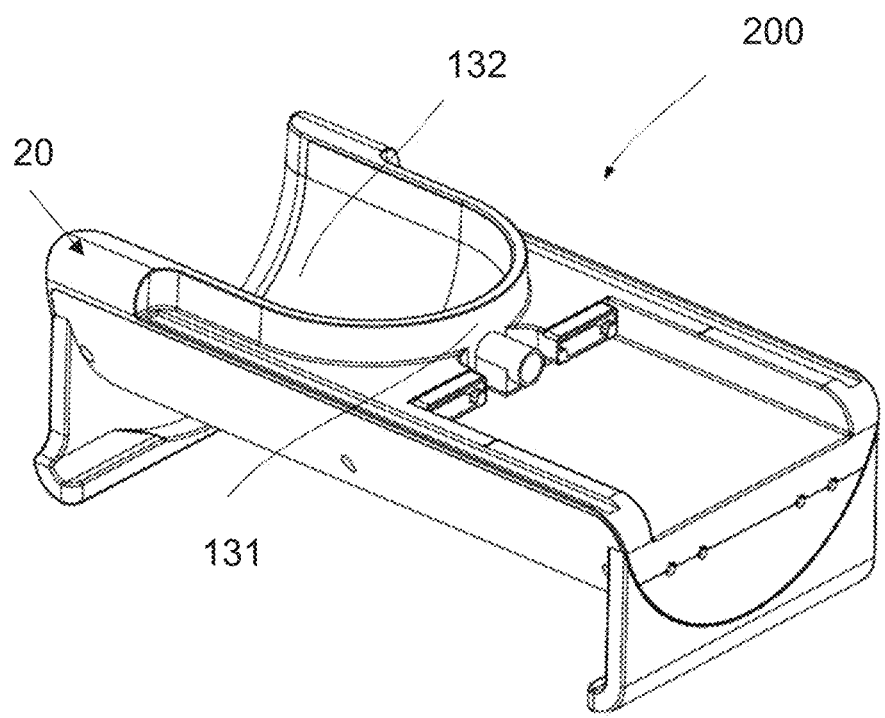
FIG. 13 is a schematic diagram illustrating an exemplary first coil structure according to some embodiments of the present disclosure.

FIG. 13 is a schematic diagram illustrating an exemplary first coil structure 200 according to some embodiments of the present disclosure. As shown in FIG. 13, the first coil structure 200 may include the lower receiver coil portion 20. The lower receiver coil portion 20 may include the second shell 131 and the container groove 132. In some embodiments, by replacing one or more components of the transmitter coil assembly 11 and the upper receiver coil portion 30 shown in FIG. 12, the first coil structure 200 may be illustrated in FIG. 13.

Figure 14:
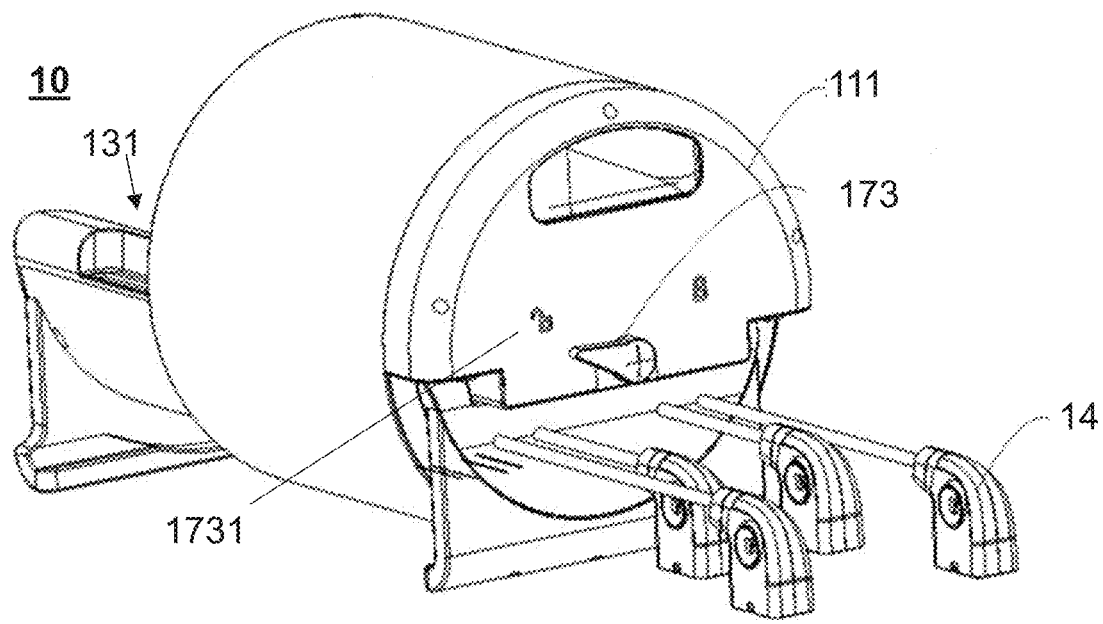
FIG. 14 is a schematic diagram illustrating an exemplary coil assembly in an unlocking configuration according to some embodiments of the present disclosure.

FIG. 14 is a schematic diagram illustrating an exemplary coil assembly 10 in an unlocking configuration according to some embodiments of the present disclosure. The plug 14 and the knob 173 may be positioned at the same end of the first shell 111, e.g., the partly closed end of the first shell 111. When the coil assembly 10 is in an unlocking configuration, at least a portion of the second shell 131 may extend out of the opposite end of the partly closed end of the first shell 111 (e.g., the opening end of the first shell 111). As shown in FIG. 14, when the coil assembly 10 is in an unlocking configuration, the knob 173 may point to an unlocking indicator 1731.

Figure 15:
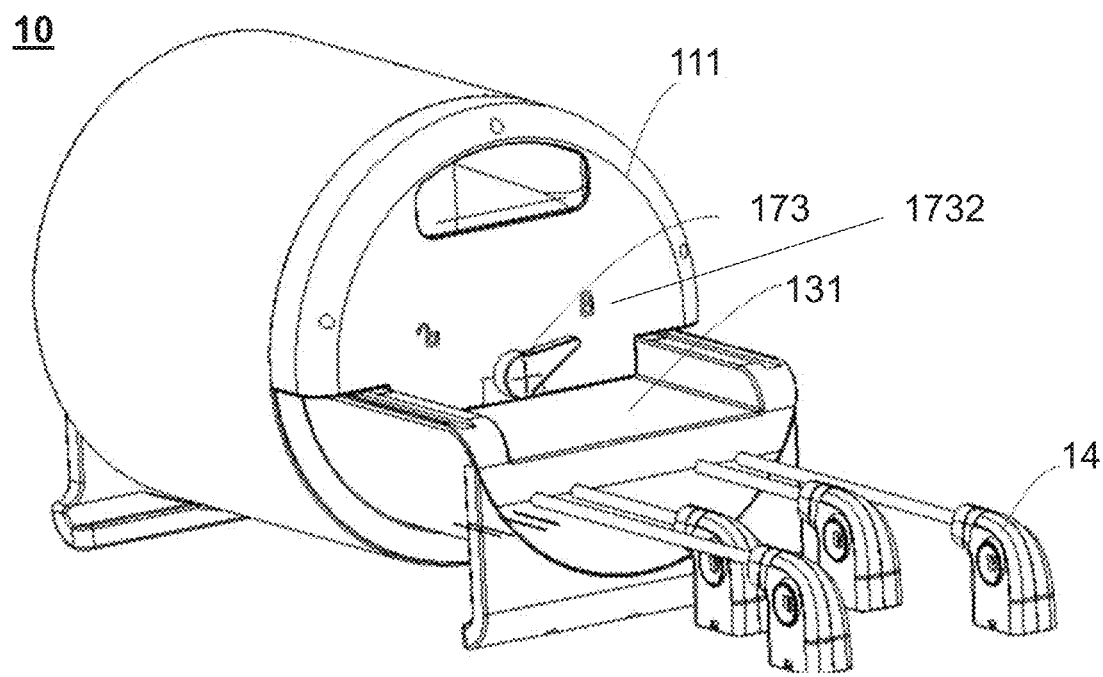
FIG. 15 is a schematic diagram illustrating an exemplary coil assembly in a locking configuration according to some embodiments of the present disclosure.

FIG. 15 is a schematic diagram illustrating an exemplary coil assembly 10 in a locking configuration according to some embodiments of the present disclosure. As shown in FIG. 15, when the coil assembly 10 is in the locking configuration, the second shell 131 may be fully drawn back relative to the opening end of the first shell 111. At the same time, an opposite end of the second shell 131 (e.g., an end with which the plug 14 is associated) may be extended out of the partly closed end of the first shell 111. The knob 173 may point to a locking indicator 1732.

In some embodiments, the coil assembly 10 may switch from the locking configuration as shown in FIG. 15 to the unlocking configuration as shown in FIG. 14 by rotating the knob 173 from pointing to the locking indicator 1732 to pointing to the unlocking indicator 1731. As shown in FIG. 14 and FIG. 6, rotating the knob 173 to point to the unlocking indicator 1731, the second shell 131 and the first shell 111 may be in the unlocking configuration. The upper receiver coil portion 30 (as shown in FIG. 9) may slide along the lower receiver coil portion 20 to break a combined structure of the upper receiver coil portion 30 the lower receiver coil portion 20 (e.g., the unbroken receiver coil as described in FIG. 2). In such a situation, the lower receiver coil portion 20 may extend out of the first shell 111 and provide the head of a patient with more movement space. In some embodiments, the extension of the lower receiver coil portion 20 relative to the first shell 111 may be achieved by moving the lower receiver coil portion 20, the first shell 111, or both. For example, instead of positioning the lower receiver coil portion 20 relatively static to ground, the transmitter coil assembly 11 which includes the first shell 111 may be positioned on the ground and the lower receiver coil portion 20 may be designed to be moveable relative to the transmitter coil assembly 11. As another example, the transmitter coil assembly 11 and the lower receiver coil portion 20 may both be moveable.

In some embodiments, the coil assembly 10 may switch from the unlocking configuration as shown in FIG. 14 to the locking configuration as shown in FIG. 15 by rotating the knob 173 from pointing to the unlocking indicator 1731 to pointing to the locking indicator 1732. As shown in FIG. 15 and FIG. 7, when a patient is positioned on a couch (e.g., the couch 400 as shown in FIG. 1), a head of the patient may be positioned in the lower receiver coil portion 20. The upper receiver coil portion 30 may slide along the lower receiver coil portion 20 to fit with the lower receiver coil portion 20. Then the second shell 131 and the first shell 111 may be locked by rotating the knob 173.

Figure 18:
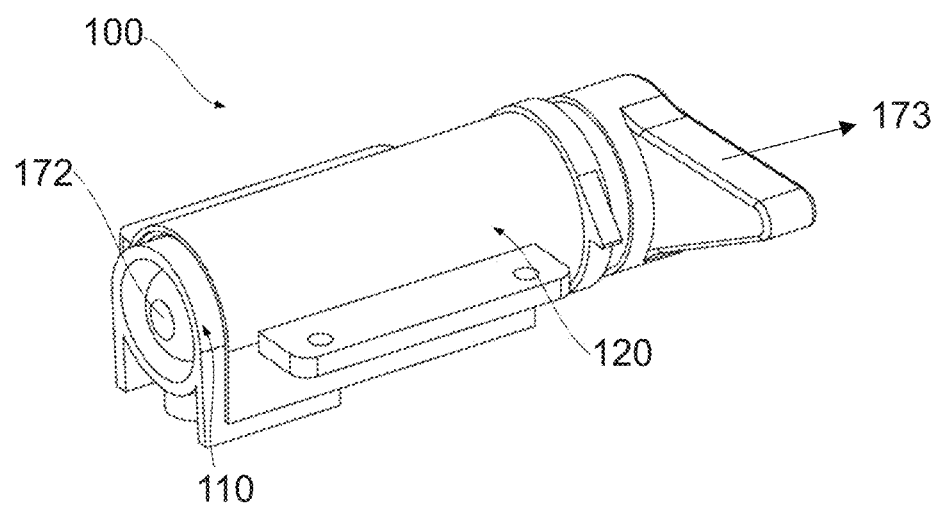
FIG. 18 is a schematic diagram illustrating an exemplary locking structure according to some embodiments of the present disclosure.

In some embodiments, the knob 173 may be included in the locking mechanism 100 as shown in FIG. 18. At least a portion of the locking mechanism 100 may be configured to limit relative movement of the first shell 111 and the second shell 131, so that risk in a long-time scanning bringing from movement and/or vibration of one or more components of the coil assembly 10 (which may be caused by movement of the patient) may be reduced.

Figure 16:
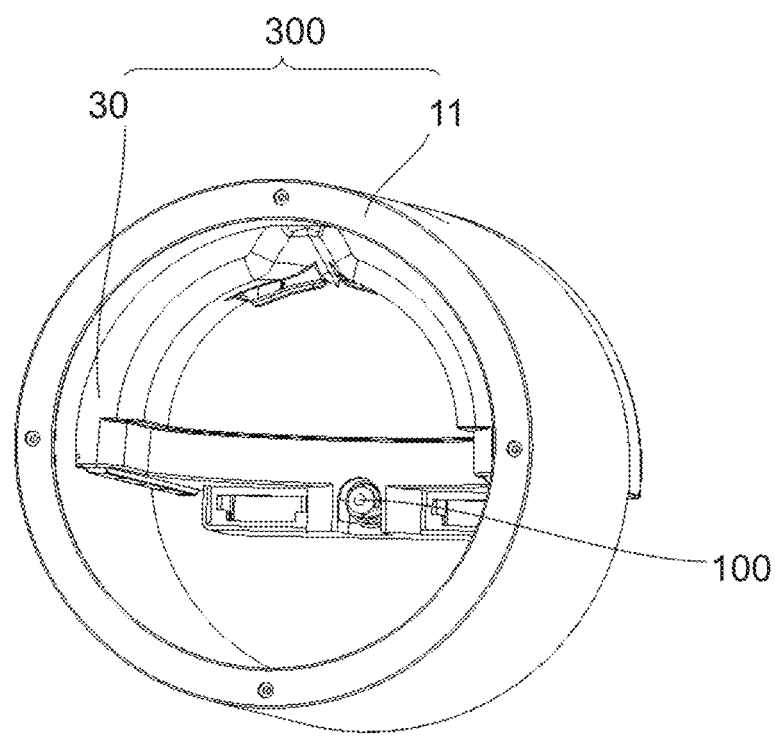
FIG. 16 is a schematic diagram illustrating an exemplary second coil structure according to some embodiments of the present disclosure.

FIG. 16 is a schematic diagram illustrating an exemplary second coil structure 300 according to some embodiments of the present disclosure. As shown in FIG. 16, seeing from a left side of the coil assembly 10 as shown in FIG. 2, the second coil structure 300 may include the transmitter coil assembly 11 and the upper receiver coil portion 30. The locking mechanism 100 may be positioned in a lower part of the upper receiver coil portion 30 for locking the upper receiver coil portion 30 and the lower receiver coil portion 20.

Figure 17:
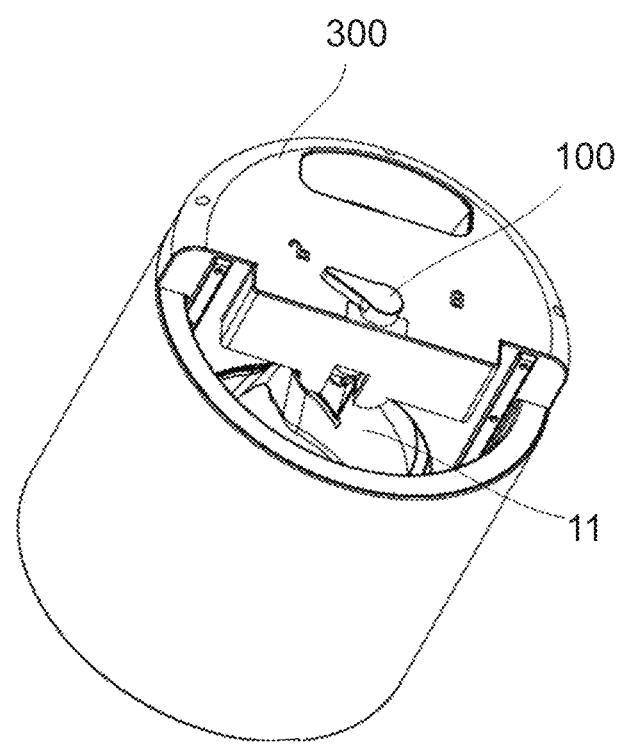
FIG. 17 is a schematic diagram illustrating an exemplary second coil structure according to some embodiments of the present disclosure.

FIG. 17 is a schematic diagram illustrating an exemplary second coil structure 300 according to some embodiments of the present disclosure. As shown in FIG. 17, seeing from a right side of the coil assembly 10 as shown in FIG. 2 with a particular angle, the transmitter coil assembly 11 may be inside of the second coil structure 300. A part of the locking mechanism 100 (e.g., the knob 173 as shown in FIG. 10) may be seen on an end (e.g., the top 119 as shown in FIG. 10) of the second coil structure 300.

FIG. 18 is a schematic diagram illustrating an exemplary locking structure according to some embodiments of the present disclosure. The locking mechanism 100 may include a locking assembly 110, an adjusting assembly 120, an adjusting rod 172, and a knob 173.

In some embodiments, the locking mechanism 100 may be configured to lock and/or unlock the first coil structure 200 with the second coil structure 300 as shown in FIG. 1. As used herein, the first coil structure 200 is locked with the second coil structure 300 indicates that the first coil structure 200 is fixed to the second coil structure 300 and can not move relative to the second coil structure 300. As used herein, the first coil structure 200 is unlocked with the second coil structure 300 indicates that the first coil structure 200 can move relative to at least one or more components of the second coil structure 300.

The locking and unlocking of the first coil structure 200 with the second coil structure 300 may be performed based on the locking assembly 110 and the adjusting assembly 120 included in the locking mechanism 100. In some embodiments, the locking assembly 110 may be positioned in the first coil structure 200 of an MRI device. The adjusting assembly 120 may be positioned in the second coil structure 300 of the MRI device. The adjusting assembly 120 may include a locking configuration and an unlocking configuration. When the adjusting assembly 120 is in the locking configuration, the adjusting assembly 120 may butt joint with the locking assembly 110 and lock by the locking assembly 110. In such a situation, the second coil structure 300 may fit with the first coil structure 200 to determine a combined structure so that the second coil structure 300 and the first coil structure 200 can not move relative to each other. When the adjusting assembly 120 disengages from the locking assembly 110, the second coil structure 300 and the first coil structure 200 can move relative to each other or break from each other. By applying a force, the combined structure including the second coil structure 300 and the first coil structure 200 may be broken.

It should be noted that, descriptions of the locking mechanism 100 is used in the MRI system 1000 of FIG. 1 for locking the second coil structure 300 and the first coil structure 200 are not intended to limit the application of the locking mechanism 100. The locking mechanism 100 may also be used in any other device where a requirement of locking is needed. For example, the locking mechanism 100 may be used in other types of coils, such as knee coil(s), ankle coil(s), abdomen coil(s), or the like. As another example, the locking mechanism 100 may be used in locking any two components. For convenience, the present disclosure will take the coil assembly 10 as an example to illustrate the structure and application of the locking mechanism 100.

Figure 19:
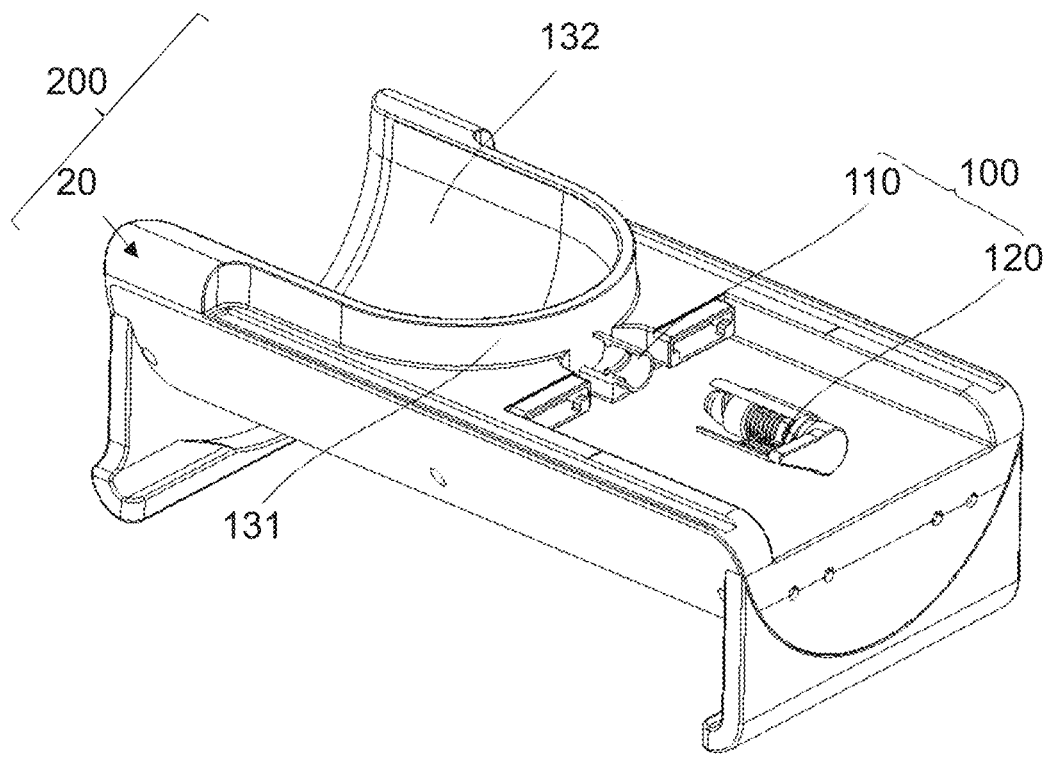
FIG. 19 is a schematic diagram illustrating an exemplary locking mechanism according to some embodiments of the present disclosure.

FIG. 19 is a schematic diagram illustrating an exemplary locking mechanism 100 according to some embodiments of the present disclosure. As shown in FIG. 19, the locking mechanism 100 may be installed on the first coil structure 200. The locking mechanism 100 may include the locking assembly 110 and the adjusting assembly 120.

In some embodiments, the locking assembly 110 may be arranged in the first coil structure 200 which includes the lower receiver coil portion 20. The lower receiver coil portion 20 may include a second shell 131 associated with the container groove 132. More details regarding the first coil structure 200 and its corresponding components may be found elsewhere in the present disclosure. See, e.g., the description in FIGS. 3 and 4.

As shown in FIG. 19, The locking assembly 110 may be fixed to the first coil structure 200. The locking assembly 110 may be configured as a locking component for locking another component (e.g., the adjusting assembly 120) of the locking mechanism 100 to make the locking mechanism 100 switches from a locking state to an unlocking state. The adjusting assembly 120 may be a moveable component of the locking mechanism 100. That is to say, the adjusting assembly 120 can move relative to the first coil structure 200. The adjusting assembly 120 may be arranged in the second coil structure 300. The adjusting assembly 120 may drive the second coil structure 300 to move to make the second coil structure 300 locked or unlocked to the first coil structure 200.

As shown in FIGS. 18 and 19, the adjusting assembly 120 may move from one position to another position. Along with the movement of the adjusting assembly 120, the second coil structure 300 may move relative to the locking assembly 110. When the adjusting assembly 120 is in the unlocking configuration (e.g., the knob 173 points to the unlocking indicator 1731 shown in FIG. 14), the adjusting assembly 120 may be separated from the locking assembly 110, so that the adjusting assembly 120 may move relative to the locking assembly 110. In such a situation, there may be a distance between the adjusting assembly 120 and the locking assembly 110. At the same time, there may be a corresponding distance between the second coil structure 300 and the first coil structure 200. That is to say, the second coil structure 300 can not cover at least a part of the first coil structure 200 to make the object to be scanned to move in or out of the first coil structure 200.

In some embodiments, when the adjusting assembly 120 is in the locking configuration (e.g., the knob 173 points to the locking indicator 1732 shown in FIG. 15), the adjusting assembly 120 may butt joint with the locking assembly 110. In such a situation, the locking assembly 110 may be locked to the adjusting assembly 120. The adjusting assembly 120 can not move relative to the locking assembly 110. At the same time, the second coil structure 300 may cover at least part of the first coil structure 200 (e.g., the container groove 132). The object to be scanned may be positioned in at least part of the first coil structure 200, which indicates that the object to be scanned may be positioned between the first coil structure 200 and the second coil structure 300. By locking to fix the second coil structure 300 with the first coil structure 200, the accuracy of scanning data of the object to be scanned may be improved.

Figure 20:
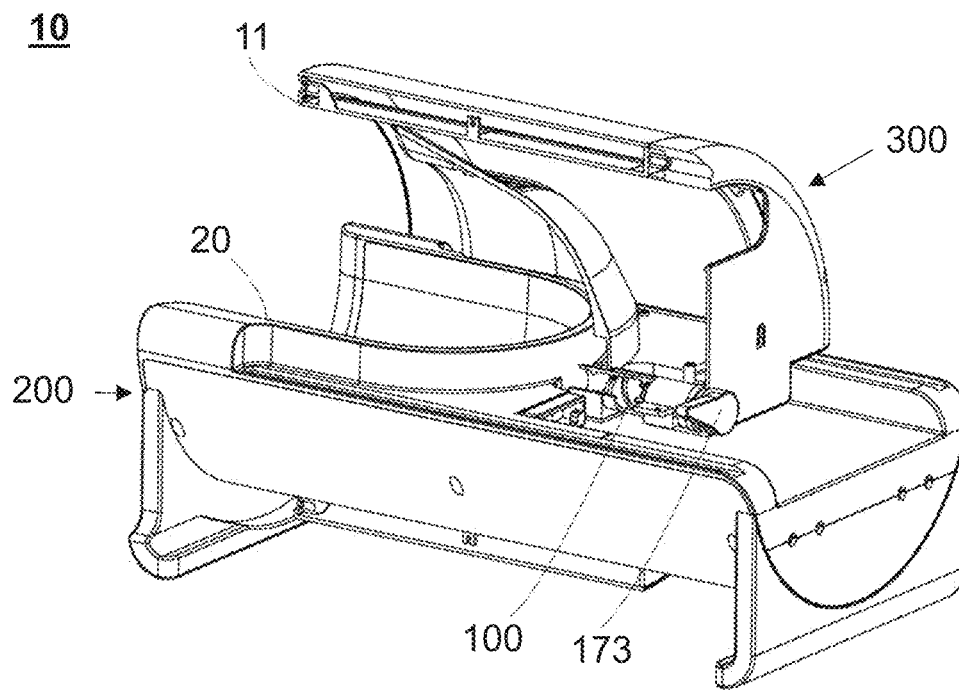
FIG. 20 is a schematic diagram illustrating an exemplary coil assembly including a locking mechanism according to some embodiments of the present disclosure.

FIG. 20 is a schematic diagram illustrating an exemplary coil assembly including a locking mechanism according to some embodiments of the present disclosure. As shown in FIG. 20, the locking structure may be configured to lock the first coil structure 200 with the second coil structure 300.

For example, when using the locking mechanism 100, the adjusting assembly 120 (shown in FIG. 19) may be positioned at an unlocking position. After positioning an object to be scanned in the first coil structure 200 (e.g., placing a head of a patient in the lower receiver coil portion 20), the second coil structure 300 may be moved toward the first coil structure 200 by pushing the adjusting assembly 120. Then part of the first coil structure 200 may be enclosed by the second coil structure 300. When the adjusting assembly 120 moves from the unlocking position to a locking position corresponding to a locking configuration, the locking assembly 110 may be configured to lock the second coil structure 300 with the first coil structure 200.

After locking the second coil structure 300 with the first coil structure 200 by the locking assembly 110, a scan operation may be performed by the MRI system 1000. Considering that the second coil structure 300 is fixed relative to the first coil structure 200, even if some vibrations occur during the scan operation, the second coil structure 300 may remain affixed to the first coil structure 200, thereby ensuring accuracy of the scan operation.

When the scan operation is finished, by pulling the adjusting assembly 120 fixed to the second coil structure 300, the second coil structure 300 may move along a direction (e.g., a direction opposite to the direction A shown in FIGS. 2, 6, and 7) to leave the first coil structure 200. With further movement of the adjusting assembly 120, the adjusting assembly 120 may be separated from the locking assembly 110 to make the second coil structure 300 separate from the first coil structure 200. In such a process, the adjusting assembly 120 may change from the locking configuration to the unlocking configuration to unlock the second coil structure 300. Then the object to be scanned may be moved out of the first coil structure 200.

By using the locking mechanism 100 in the MRI system 1000, the problem of relative movement of the first coil structure 200 and the second coil structure 300 during the scan operation may be solved. More details, switching from locking status and unlocking status between the locking assembly 110 and the adjusting assembly 120, the second coil structure 300 may be fixed to the first coil structure 200 when needed to avoid undesirable movement of the second coil structure 300.

Figure 21A:
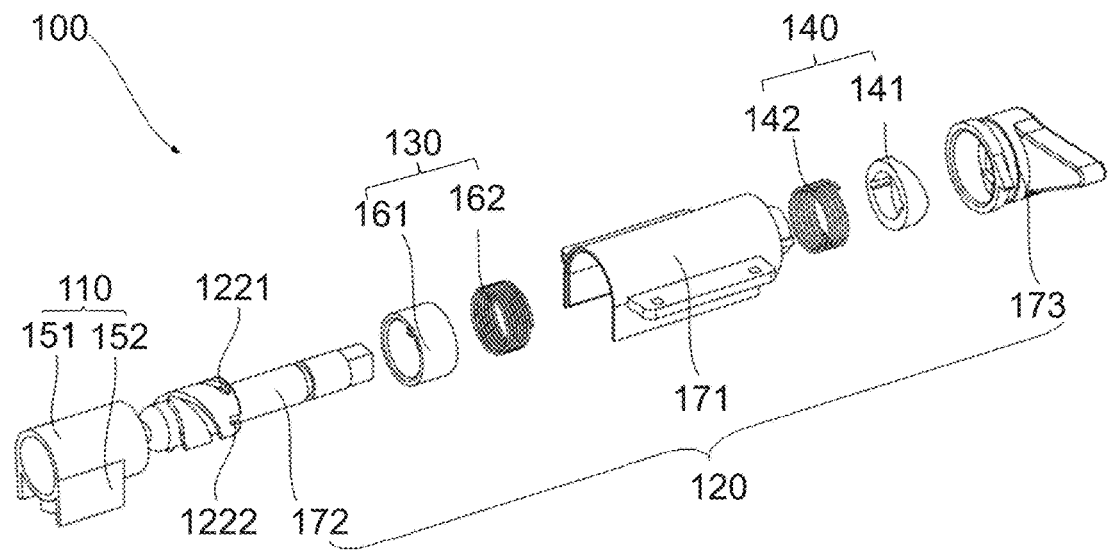
FIGS. 21A and 21B are explosion diagrams illustrating an exemplary locking mechanism according to some embodiments of the present disclosure.
Figure 21B:
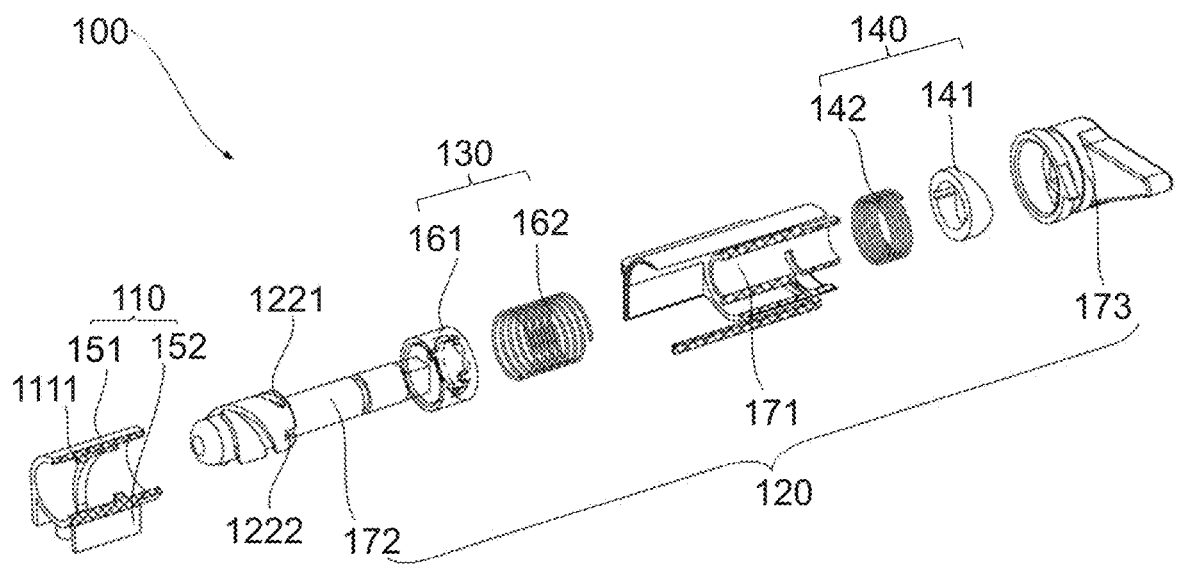

FIGS. 21A and 21B are explosion diagrams illustrating an exemplary locking mechanism 100 according to some embodiments of the present disclosure. As shown in FIG. 21A, the locking mechanism 100 may include the locking assembly 110 and the adjusting assembly 120. The locking assembly 110 may include a locking shell 151 and a mounting component 152. The locking shell 151 is shown with a longitude section in FIG. 21B. The mounting shell 171 is shown with a longitude section in FIG. 21B.

The locking mechanism 100 may be configured to lock two structures (e.g., the first coil structure 200 and the second coil structure 300). The locking assembly 110 may be configured to fix on one of the two structures. The adjusting assembly 120 may be configured to fix on another one of the two structures. By locking the adjusting assembly 120 with the locking assembly 110, the two structures may be locked. As used herein, locking a first structure with a second structure indicates that fixing the relative position of the first structure and the second structure. In other work, locking a first structure with a second structure indicates that fixing at least one or more components of the first structure with at least one or more components of the second structure to make the at least one or more components of the first structure can not move relative to the at least one or more components of the second structure. The first structure and the second structure may be position in any relative space relationship, e.g., left and right, upper and lower, or the like.

In some embodiments, the locking assembly 110 may be fixed to the first coil structure 200 (shown in FIG. 19). The locking shell 151 may be directly fixed to the first coil structure 200 or fixed to the first coil structure 200 through one or more fixing components. For example, the mounting component 152 may be fixed to the first coil structure 200. The locking shell 151 may further be fixed to the mounting component 152 for fixing on the first coil structure 200. It should be noted that, the mounting component 152 may be any structure that can fix the locking shell 151 to the first coil structure 200. Exemplary, the mounting component 152 may include a supporting plate.

As shown in FIGS. 21A and 21B, the adjusting assembly 120 may include an adjusting rod 172, a self-locking assembly 130, a mounting shell 171, an angle adjusting assembly 140, and a knob 173. In some embodiments, the adjusting assembly 120 may include the mounting shell 171 and the adjusting rod 172. The mounting shell 171 may be fixed to the second coil structure 300. The adjusting rod 172 may drive the mounting shell 171 to move along a direction (e.g., the direction A shown in FIGS. 2, 6, and 7) and rotate relative to the mounting shell 171. When the adjusting rod 172 moving along the direction, a head of the adjusting rod 172 may be moved into the locking assembly 110.

The mounting shell 171 may be configured to install the adjusting assembly 120 to the second coil structure 300. When the second coil structure 300 moves, the adjusting assembly 120 may also synchronize moves based on the existence of the mounting shell 171. When the adjusting assembly 120 is locked by the locking assembly 110, further movement of the second coil structure 300 may be stopped to avoid over movement. By fixing the mounting shell 171 to the second coil structure 300, interference between the mounting shell 171 and the second coil structure 300 during their movements may be avoided to ensure accuracy of their movements.

In some embodiments, the mounting shell 171 may also be configured to protect the adjusting assembly 120. One or more movable components of the adjusting assembly 120 may be positioned in the mounting shell 171 to avoid undesirable contact with the outside components. That may make sure accuracy of movements of the one or more movable components of the adjusting assembly 120. Then the adjusting assembly 120 may accurately fit with the locking assembly 110 to achieve successful locking and unlocking. In some embodiments, the one or more movable components of the adjusting assembly 120 may include the adjusting rod 172. The adjusting rod 172 may be covered by the mounting shell 171. The adjusting rod 172 may rotate in the mounting shell 171. In some embodiments, rotation of the adjusting rod 172 may lead to a movement along a direction (e.g., the direction A shown in FIGS. 2, 6, and 7) of both the adjusting rod 172 and the mounting shell 171.

The locking shell 151 may be configured to receive and lock the adjusting rod 172. When the adjusting rod 172 is extended into and connected with the locking shell 151, the locking shell 151 may fix the adjusting rod 172 at a locking position. When the adjusting rod 172 is fixed at the locking position, the adjusting rod 172 may not move without unlocking the locking assembly 110, so that the second coil structure 300 may be locked with the first coil structure 200 as shown in FIG. 3. When the adjusting rod 172 is released from the locking position, the locking shell 151 may not limit the movement of the adjusting rod 172, the adjusting rod 172 may no longer be positioned in the locking shell 151 and the first coil structure 200 may separate with the second coil structure 300. That is to say, the first coil structure 200 may move relative to the second coil structure 300.

In some embodiments, the adjusting rod 172 may be connected to an inner surface of the locking shell 151 through a groove and protuberance structure. For example, the adjusting rod 172 may include a spiral groove 1221 on the outside surface of the adjusting rod 172. The spiral groove 1221 may extend in a spiral line surrounding an axial direction of the adjusting rod 172. The locking shell 151 may include a first locking protuberance 1111 (shown in FIG. 22B) on its inner surface. A projection of the first locking protuberance 1111 to a cross-section plane of the locking shell 151 may include a shape of a square, rectangle, strip, or one or more rectangles be connected to each other, or the like. In some embodiments, the first locking protuberance 1111 may be arranged along a redial direction of the locking shell 151. The first locking protuberance 1111 may be connected with the spiral groove 1221. By rotating the adjusting rod 172, the adjusting rod 172 may move forward to the locking shell 151, at the same time the first locking protuberance 1111 may be engaged with the spiral groove 1221 to lock the adjusting rod 172.

In some embodiments, when a head of the adjusting rod 172 moves into the locking shell 151, a first end of the spiral groove 1221 may become connected with the first locking protuberance 1111 at a connection point of the first locking protuberance 1111. That is to say, the first locking protuberance 1111 may enter an opening of the spiral groove 1221. By rotating the adjusting rod 172 in a first direction (e.g., in clockwise direction), the spiral groove 1221 of the adjusting rod 172 may slide along the first locking protuberance 1111. The first end of the spiral groove 1221 may move far away from the connection point, at the same time a second end of the spiral groove 1221 (i.e., an end opposite to the first end of the spiral groove 1221, referred to a limiting end of the spiral groove 1221) may move near to the connection point. When the first locking protuberance 1111 abuts against the second end of the spiral groove 1221 (e.g., the first locking protuberance 1111 connects with the second end of the spiral groove 1221 at the connection point of the first locking protuberance 1111), the adjusting rod 172 may not slide along the first locking protuberance 1111 anymore. It indicates the adjusting rod 172 is positioned in a locking position. When unlocking the locking assembly 110, the adjusting rod 172 may be rotated conversely to the first direction. By rotating the adjusting rod 172 in a direction conversely to the first direction (e.g., in anticlockwise direction), the adjusting rod 172 may drive the spiral groove 1221 slides along the first locking protuberance 1111 to make the head of the adjusting rod 172 gradually extend out of the locking shell 151. After the first locking protuberance 1111 disconnects with the spiral groove 1221, the adjusting rod 172 may be moved along an axial direction of the locking assembly 110 so that the adjusting rod 172 may be unlocked with the locking shell 151.

In some embodiments, the spiral groove 1221 may include more than one (e.g., 2, 3, or 4) spiral sub-grooves. For example, the spiral groove 1221 may include a first spiral sub-groove and a second spiral sub-groove. A phase difference of the first spiral sub-groove and the second spiral sub-groove may be 180°. The first locking protuberance 1111 may include two locking sub-protuberances, each of which corresponds to one of the first spiral sub-groove and the second spiral sub-groove.

The adjusting assembly 120 may further include the knob 173. The knob 173 may be configured to derive the rotating of the adjusting rod 172 when a force is applied on the knob 173. In some embodiments, an end of the adjusting rod 172 may extend out of the mounting shell 171 and be exposed in an inner space defined by the second coil structure 300. The knob 173 may be fixed on the above-mentioned end of the adjusting rod 172. By rotating knob 173, the adjusting rod 172 may be driven to rotate and move along an axial direction of the locking assembly 110 to lock or unlock the adjusting rod 172. That is to say, the locking assembly 110 may convey radial movement of the knob 173 to linear movement of the adjusting rod 172 to switch the locking assembly 110 between locking and unlocking.

The knob 173 may include any structure, such as, a spanner, a rocker arm, or the like. In some embodiments, the rotating of the knob 173 may include a moment structure. For example, the knob 173 may be connected to the adjusting rod 172 at a first point of the knob 173. The first point may also be a point at an axial of rotation of the knob 173 and the adjusting rod 172. A length from a force point at an end of the knob 173 to the first point of the knob 173 may define a force-distance. For driving the head of the adjusting rod 172 to move a specific distance along the axial direction of the locking assembly 110, the longer the force-distance is, the smaller a force will be needed.

In some embodiments, the knob 173 may stand a pulling force or a pushing force for driving the second coil structure 300, which is fixed connected to the locking assembly 110, to slide relative to the first coil structure 200.

In some embodiments, the locking mechanism 100 may further include a self-locking assembly 130. The self-locking assembly 130 may be movably arranged in the mounting shell 171. For example, the self-locking assembly 130 may move along an axial direction of the mounting shell 171. The self-locking assembly 130 may be sheathed on the adjusting rod 172. The self-locking assembly 130 may be configured to limit the movement (e.g., rotating) of the adjusting rod 172 when the adjusting rod 172 is in one or more positions corresponding to the unlocking configuration (e.g., the unlocking position shown in FIG. 22). If the adjusting rod 172 moves to a rotating position, rotating the adjusting rod 172 may no longer be limited by the self-locking assembly 130. More details regarding the locking position, the unlocking position, and the rotating position may be found elsewhere in the present disclosure. See, e.g., the description in connection with FIG. 22.

In some embodiments, if the adjusting rod 172 is not displaced at the unlocking position, the opening of the spiral groove 1221 may point to the first locking protuberance 1111 when the adjusting rod 172 switches between the unlocking configuration and the locking configuration. If the adjusting rod 172 is displaced by an angle at the unlocking position, the opening of the spiral groove 1221 may depart from the first locking protuberance 1111 by a corresponding angle when the adjusting rod 172 switches from the unlocking configuration to the locking configuration. In such a situation, the spiral groove 1221 may not match the first locking protuberance 1111 (i.e., the first locking protuberance 1111 may not enter the opening of the spiral groove 1221) to lock the adjusting rod 172.

In order to avoid the above-mentioned departure between the first locking protuberance 1111 and the opening of the spiral groove 1221, the self-locking assembly 130 may be applied in the locking mechanism 100. By the application of the self-locking assembly 130, the adjusting rod 172 may be locked in the unlocking position. Accordingly, when the adjusting rod 172 moves toward a locking position to cause the locking mechanism 100 to switch to the locking configuration, the opening of the spiral groove 1221 may point at the first locking protuberance 1111. As a result, the adjusting rod 172 may match the locking shell 151 and be locked by the locking shell 151. The second coil structure 300 can be fixed and locked with the first coil structure 200.

In some embodiments, the adjusting rod 172 may further include a self-locking groove 1222. The self-locking assembly 130 may include a self-locking slide 161. The self-locking slide 161 may be sheathed on the adjusting rod 172. An inner surface of the self-locking slide 161 may include a second locking protuberance 1611 (shown in FIGS. 28 and 29). The second locking protuberance 1611 may move in and out of the self-locking groove 1222 to limit the rotating of the adjusting rod 172 or release the limitation. When the second locking protuberance 1611 moves into the self-locking groove 1222, the second locking protuberance 1611 may stop the rotating of the adjusting rod 172. More details regarding the second locking protuberance 1611 may be found elsewhere in the present disclosure. See, e.g., the description in connection with the self-locking slide 161 in FIGS. 28 and 29.

In some embodiments, the self-locking slide 161 may be connected to the mounting shell 171 via a slide connection. The mounting shell 171 may limit the rotation of the self-locking slide 161. That is to say, the self-locking assembly 130 may not rotate. The self-locking slide 161 may move along an axial direction of the mounting shell 171. The self-locking slide 161 is affixed on a surface of the adjusting rod 172, and so when the adjusting rod 172 moves, the self-locking slide 161 may also move. Before the locking shell 151 connects with the self-locking slide 161, the adjusting rod 172 and the self-locking slide 161 may keep relatively stationary to each other. When the locking shell 151 connects with the self-locking slide 161, the adjusting rod 172 may further move relative to the self-locking slide 161.

When the adjusting rod 172 is at the unlocking position, the second locking protuberance 1611 of the self-locking slide 161 may fit with the self-locking groove 1222 of the adjusting rod 172. In such a situation, rotating the self-locking slide 161 may be limited by the mounting shell 171. As a result, the adjusting rod 172 may be limited at the unlocking position and can not rotate.

By rotating the knob 173, the adjusting rod 172 may move toward the locking shell 151. When the head of the adjusting rod 172 gradually moves into the locking shell 151, the locking shell 151 may stop further movement of the self-locking slide 161 to make the self-locking slide 161 separate from the adjusting rod 172. From this moment, the self-locking slide 161 may not move, along with the adjusting rod 172, toward the locking shell 151 any more. As a result, the second locking protuberance 1611 of the self-locking slide 161 may gradually separate with the self-locking groove 1222 to release rotating limitation to the adjusting rod 172. Then the adjusting rod 172 may be regarded as in a rotating position.

Moving the adjusting rod 172 from the locking position to the unlocking position, the adjusting rod 172 may gradually move out of the locking shell 151. At the same time, the self-locking groove 1222 may gradually move toward the second locking protuberance 1611. When the head of the adjusting rod 172 moves out of the locking shell 151, the second locking protuberance 1611 may gradually move into the self-locking groove 1222. The adjusting rod 172 may drive the self-locking slide 161 to move away from the locking shell 151 and toward the mounting shell 171 until the adjusting rod 172 reaches the unlocking position. At the unlocking position, the self-locking slide 161 may limit further rotating of the adjusting rod 172 by making the second locking protuberance 1611 fit with the self-locking groove 1222.

In some embodiments, the self-locking assembly 130 may further include an elastic component 162. The elastic component 162 may sheathe on the adjusting rod 172. A first end of the elastic component 162 may butt joint with the self-locking slide 161. A second end of the elastic component 162 may be fixed with the adjusting rod 172. At the unlocking position, the elastic component 162 may provide an elastic force to push the second locking protuberance 1611 locked in the self-locking groove 1222. At the rotating position, the locking shell 151 may push the self-locking slide 161 to compress the elastic component 162 to make the second locking protuberance 1611 separate from the self-locking groove 1222.

At the unlocking position, the elastic component 162 may be configured to provide a force to make the second locking protuberance 1611 be locked in the self-locking groove 1222. The existence of the force provided by the elastic component 162 may make the second locking protuberance 1611 not move out of the self-locking groove 1222 at the unlocking position and make the second locking protuberance 1611 keep effective engagement with the self-locking groove 1222. In some embodiments, the elastic component 162 may further be configured to help the self-locking slide 161 to automatically reset (e.g., moving from a first position near the locking shell 151 to a second position far from the locking shell 151) for keeping relative position relationship of the self-locking slide 161 and the adjusting rod 172 to avoid undesired movement of the adjusting rod 172 caused by accidental vibrations and/or other forces at the unlocking position. That is to say, the elastic component 162 may further be configured to improve the reliability of keeping the adjusting rod 172 at the unlocking position in the unlocking mode. In some embodiments, the elastic component 162 may include a spring. A first end of the elastic component 162 may butt joint with the self-locking slide 161. A second end of the elastic component 162 may butt joint with the adjusting rod 172.

When the adjusting rod 172 moves from the unlocking position to the rotating position, the adjusting rod 172 may drive the self-locking slide 161 and the elastic component 162 to move toward the locking shell 151. When the adjusting rod 172 moves into the locking shell 151, the locking shell 151 may push the self-locking slide 161 apply a force to the elastic component 162 to make the second locking protuberance 1611 gradually move out of the self-locking groove 1222. Then the adjusting rod 172 may rotate. When the adjusting rod 172 moves from the rotating position to the unlocking position, the adjusting rod 172 may gradually move out of the locking shell 151. The locking shell 151 may provide smaller force on the self-locking slide 161 gradually to make the elastic component 162 push the self-locking slide 161 moves toward the self-locking groove 1222. When the adjusting rod 172 moves out of the locking shell 151, the locking shell 151 may separate with the self-locking slide 161. At the same time, the elastic force of the elastic component 162 may drive the self-locking slide 161 to reset. That is to say the second locking protuberance 1611 may fit with the self-locking groove 1222 to limit rotate of the adjusting rod 172 at the unlocking position.

In some embodiments, the locking mechanism 100 may include an angle adjusting assembly 140. The angle adjusting assembly 140 may be positioned between the mounting shell 171 and the knob 173. The angle adjusting assembly 140 may be configured to lock and fix the knob 173. The angle adjusting assembly 140 may further be configured to enhance a rotating resistance force to rotate the knob 173. By application of the angle adjusting assembly 140, a higher force applying to the knob 173 may be needed to drive the adjusting rod 172 rotating along with the knob 173. That is to say, the angle adjusting assembly 140 may influence or partly determine a minimum threshold applying to the knob 173 to drive the adjusting rod 172 to rotate. So accidental vibration or some other forces below the minimum threshold may exert minimal or no influence on the stability of the adjusting rod 172 and the adjusting rod 172 may experience minimal or no undesired rotation. More details regarding the angle adjusting assembly 140 may be found elsewhere in the present disclosure. See, e.g., FIGS. 27, 30, and 31 and the description thereof.

Figure 22:
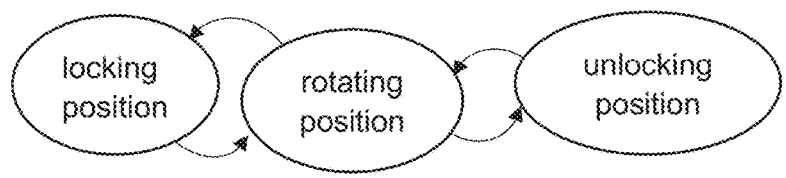
FIG. 22 is a schematic diagram illustrating exemplary positions of the adjusting rod according to some embodiments of the present disclosure.

FIG. 22 is a schematic diagram illustrating exemplary positions of the adjusting rod 172 according to some embodiments of the present disclosure. By applying a force to the adjusting rod 172, the adjusting rod 172 may move from an unlocking position to a rotating position and further to a locking position. When the adjusting rod 172 is in the unlocking position and the rotating position the locking mechanism 100 may be in the unlocking configuration which means the adjusting assembly 120 is released from the locking assembly 110. When the adjusting rod 172 is in the locking position, the locking mechanism 100 may be in the locking configuration which means the adjusting assembly 120 is locked by the locking assembly 110.

In some embodiments, the unlocking position may include one or more positions where rotation of the adjusting rod 172 is locked by the self-locking assembly 130. When the adjusting rod 172 is at the unlocking position, the second locking protuberance 1611 may engage with the self-locking groove 1222 to limit rotation of the adjusting rod 172. At the unlocking position, the adjusting rod 172 is not locked by the locking assembly 110, and the adjusting assembly 120 may move together with the mounting shell 171.

By constantly applying force to the adjusting rod 172, the adjusting rod 172 may move from the unlocking position to the rotating position. In such a process, the adjusting rod 172 may move along with the self-locking slide 161 until the self-locking slide 161 contacts with the locking shell 151. When the self-locking slide 161 contacts with locking shell 151, the locking shell 151 may stop further movement of the self-locking slide 161 to make the second locking protuberance 1611 separate from the self-locking groove 1222.

Changing from the unlocking position to the rotating position, the second locking protuberance 1611 may separate with the self-locking groove 1222 so that the self-locking assembly 130 no matter limits the rotation of the adjusting rod 172. At the rotating position, the adjusting rod 172 may rotate along a locking direction. Rotation of the adjusting rod 172 may lead to a movement of the adjusting assembly 120 along the axial direction of the adjusting rod 172. When the first locking protuberance 1111 moves to the opening of the spiral groove 1221, the head of the adjusting rod 172 may be gradually covered by the locking shell 151 until the adjusting rod 172 arrived at the locking position.

When the adjusting rod 172 arrived at the locking position, the first locking protuberance 1111 may butt joint with a limitation end of the spiral groove 1221. As used herein, the limitation end of the spiral groove 1221 may be an end opposite to the opening of the spiral groove 1221. Then the adjusting rod 172 may no longer rotate and move. That is to say, the adjusting rod 172 is locked by the locking assembly 110 through the engagement of the first locking protuberance 1111 and the spiral groove 1221.

When unlocking the adjusting rod 172, the adjusting rod 172 may be rotated along an unlocking direction that is opposite to the locking direction. By constantly rotating the adjusting rod 172 along the unlocking direction, the adjusting rod 172 may pass the rotating position and arrive at the unlocking position.

In some embodiments, the rotating of the adjusting rod 172 may be caused by the rotating of the knob 173 shown in FIGS. 22A and 22B. By rotating the knob 173, the adjusting rod 172 may move, along the axial direction of adjusting rod 172, from the unlocking position to the rotating position. By further rotating the knob 173, the adjusting rod 172 may further move and rotate at the rotating position until the adjusting rod 172 reaches the locking position. By rotating the knob 173 along the opposite direction, the adjusting rod 172 may move from the locking position to the rotating position and further to the unlocking position.

It some embodiments, the adjusting rod 172 may be installed on the second coil structure 300 through the mounting shell 171. The locking shell 151 may be fixed on the first coil structure 200. Then relative movement between the adjusting rod 172 and the locking shell 151 may correspond to the relative movement between the second coil structure 300 and the first coil structure 200. That is to say the adjusting rod 172 may move together with the second coil structure 300 and the locking shell 151 may move together with the first coil structure 200. By locking the adjusting rod 172 with the locking shell 151, the relative movement of the second coil structure 300 to the first coil structure 200 may be limited.

Figure 23:
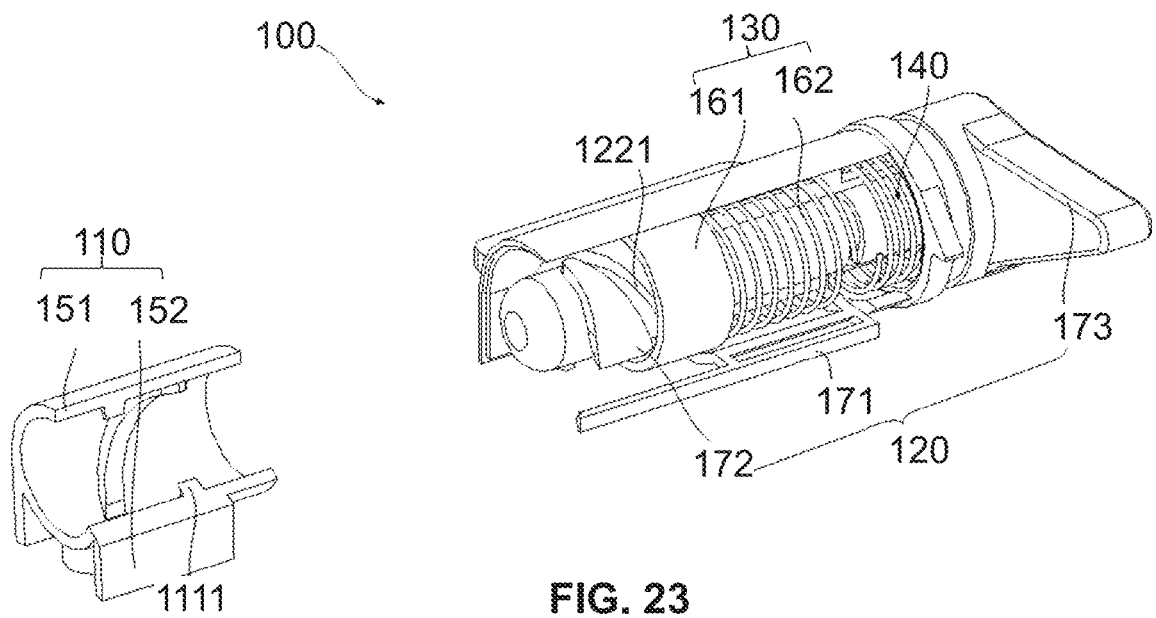
FIGS. 23 and 24 are schematic diagrams illustrating an exemplary locking structure according to some embodiments of the present disclosure.
Figure 24:
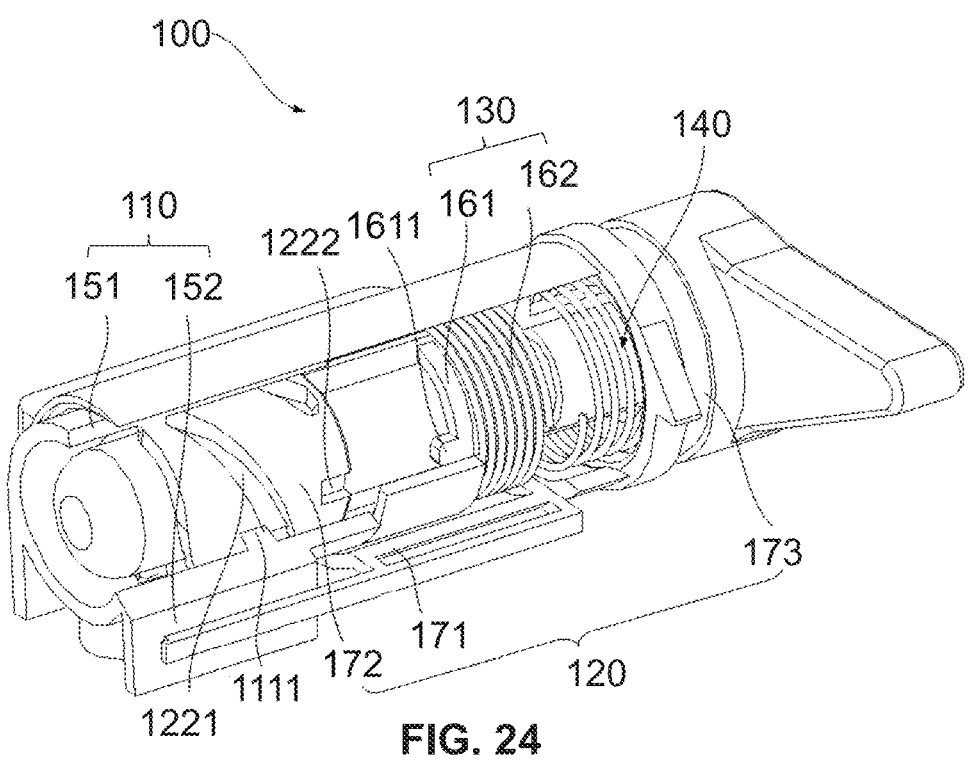

FIGS. 23 and 24 are schematic diagrams illustrating an exemplary locking structure 100 according to some embodiments of the present disclosure. The adjusting rod 172 of the locking structure 100 illustrated in FIG. 23 may be at an unlocking position. The adjusting rod 172 of the locking structure 100 illustrated in FIG. 24 may be at a rotating position.

As shown in the FIG. 23, when the adjusting rod 172 is at the unlocking position, the adjusting rod 172 may be covered by the mounting shell 171 and rotating of the adjusting rod 172 may be limited by the self-locking assembly 130. When the adjusting rod 172 moves from the unlocking position to the locking position, the second locking protuberance 1611 may gradually separate with the self-locking groove 1222 as shown in FIG. 24. Then rotating of the adjusting rod 172 may not be limited by the self-locking assembly 130 anymore. In such a situation, rotating of the knob 173 may lead to the rotating of the adjusting rod 172 and further moving of the adjusting rod 172. The second locking protuberance 1611 shown in FIG. 24 may include any shape that may be fit with the self-locking groove 1222.

Figure 25:
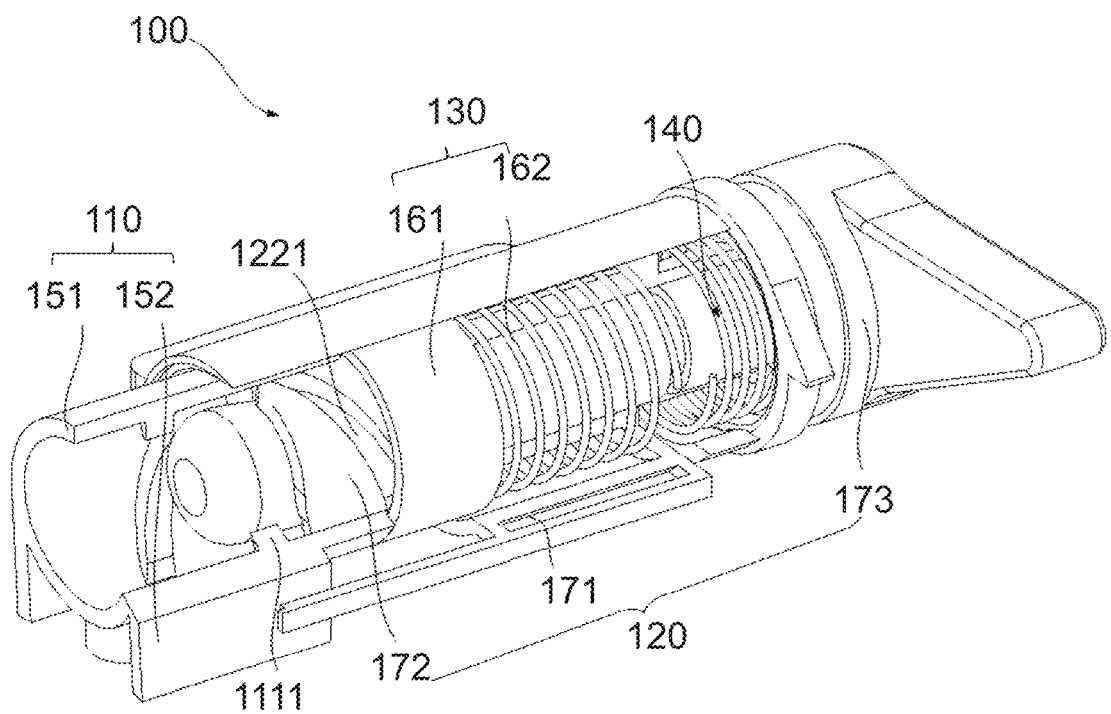
FIGS. 25 and 26 are schematic diagrams illustrating an exemplary locking structure according to some embodiments of the present disclosure.
Figure 26:
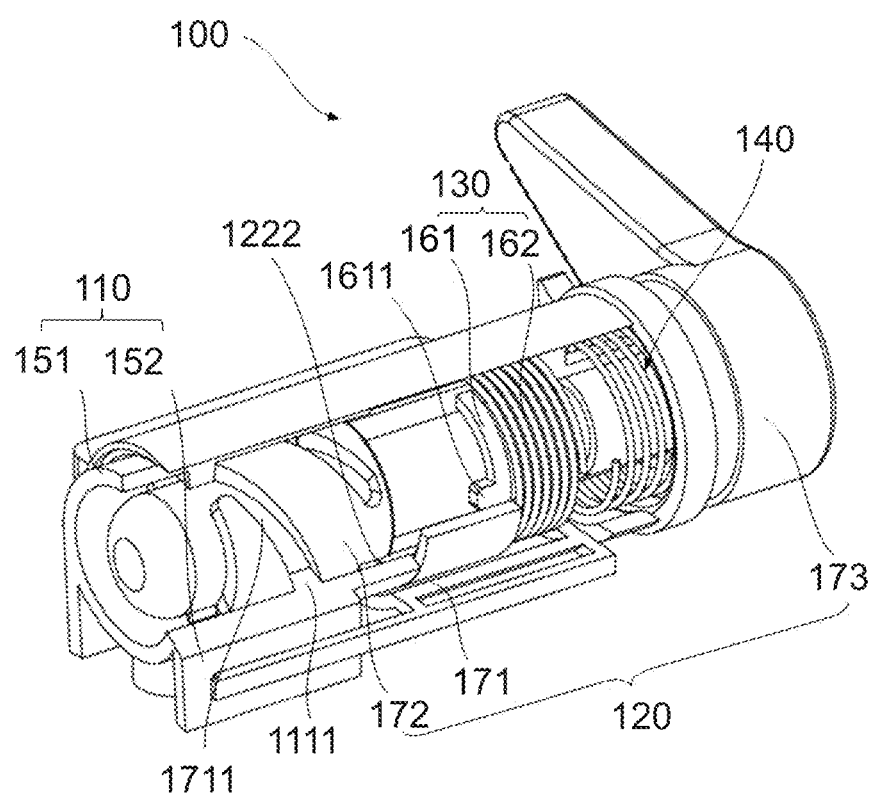

FIGS. 25 and 26 are schematic diagrams illustrating an exemplary locking structure 100 according to some embodiments of the present disclosure. The adjusting rod 172 of the locking structure 100 shown in FIG. 25 may be at a rotating position. The adjusting rod 172 of the locking structure 100 shown in FIG. 26 may be at a locking position.

As shown in FIGS. 25 and 26, by rotating the adjusting rod 172, the adjusting rod 172 may further move toward the locking structure 100 and be locked by the locking assembly 110 when the adjusting rod 172 reaches the locking position. When the adjusting rod 172 is locked by the locking assembly 110, one or more components of the locking assembly 110 (e.g., the locking shell 151, the mounting component 152) may be covered by the mounting shell 171.

Figure 27:
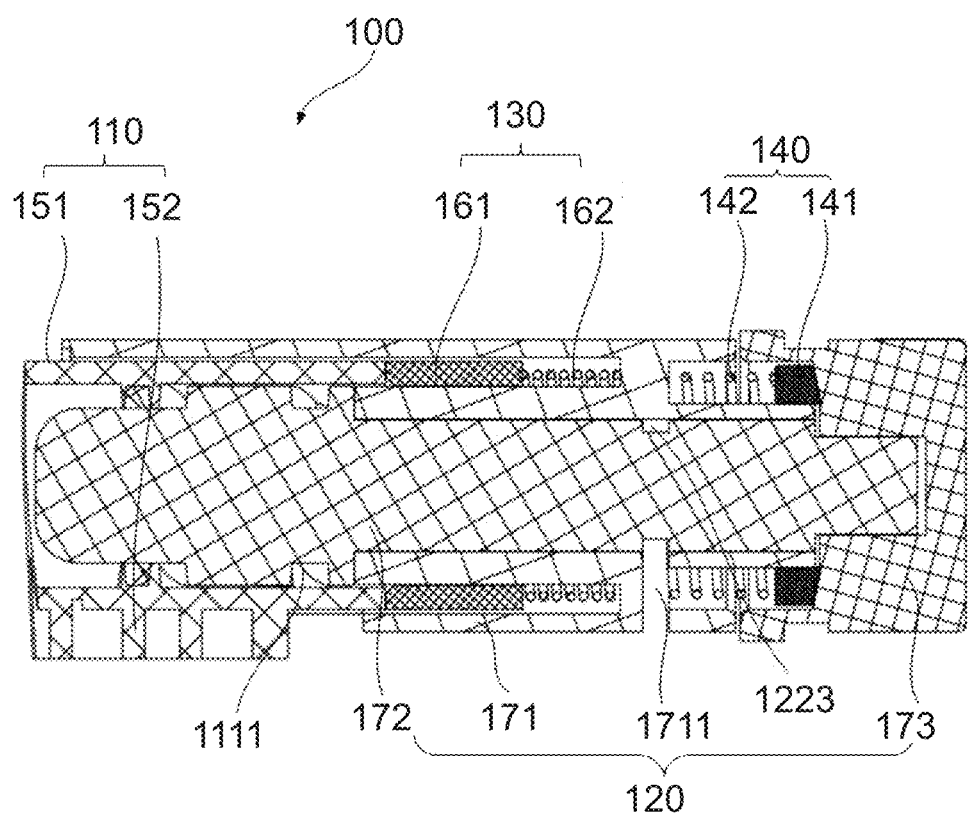
FIG. 27 is a schematic diagram illustrating a section view of an exemplary locking structure according to some embodiments of the present disclosure.

FIG. 27 is a schematic diagram illustrating a section view of an exemplary locking structure 100 according to some embodiments of the present disclosure.

In some embodiments, the locking mechanism 100 may be connected to the second coil structure 300 (shown in FIG. 17). The second coil structure 300 may move synchronously with the locking mechanism 100. For example, referring to FIG. 3, by pushing or pulling the locking mechanism 100 through the knob 173 of the locking mechanism 100, the second coil structure 300 may move forward or backward along a rail (e.g., the rail 1312 shown in FIG. 4). The synchronous movement of the locking mechanism 100 and the second coil structure 300 may be performed based on a force conduction mechanism between the knob 173 and the second coil structure 300. In some embodiments, the force conduction mechanism between the knob 173 and the second coil structure 300 may be performed based on a connection between the knob 173 and the adjusting rod 172, a connection between the adjusting rod 172 and the mounting shell 171, and a connection between the mounting shell 171 and the second coil structure 300. More details regarding the connection between the knob 173 and the adjusting rod 172, the connection between the mounting shell 171 and the second coil structure 300, and the connection between the adjusting rod 172 and the mounting shell 171 may be found elsewhere in the present disclosure. See, e.g., FIGS. 21A and 21B and the description thereof.

Figure 28:
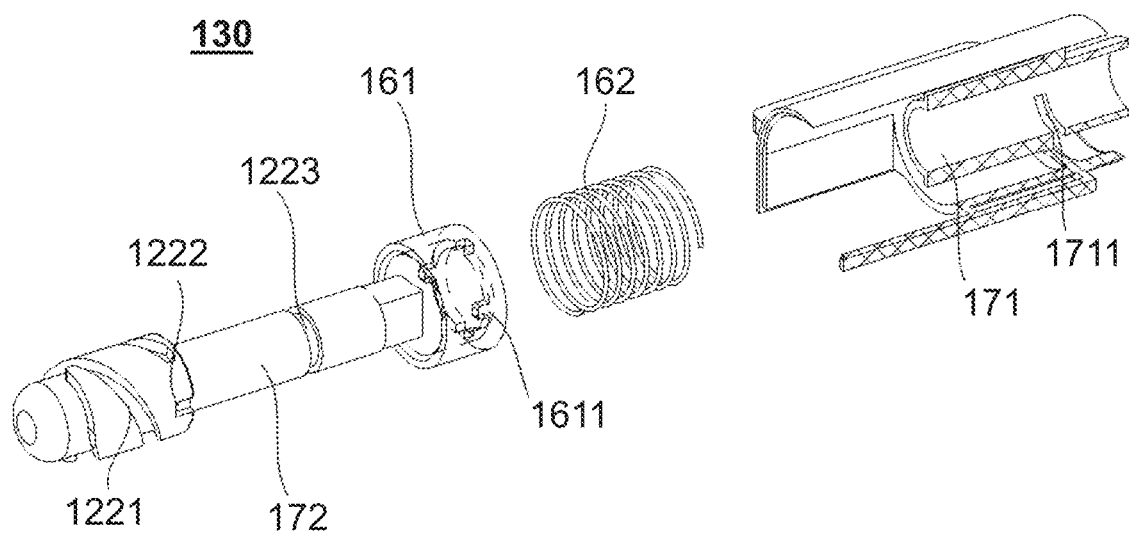
FIG. 28 is an explosion diagram illustrating an exemplary self-locking assembly according to some embodiments of the present disclosure.
Figure 31:
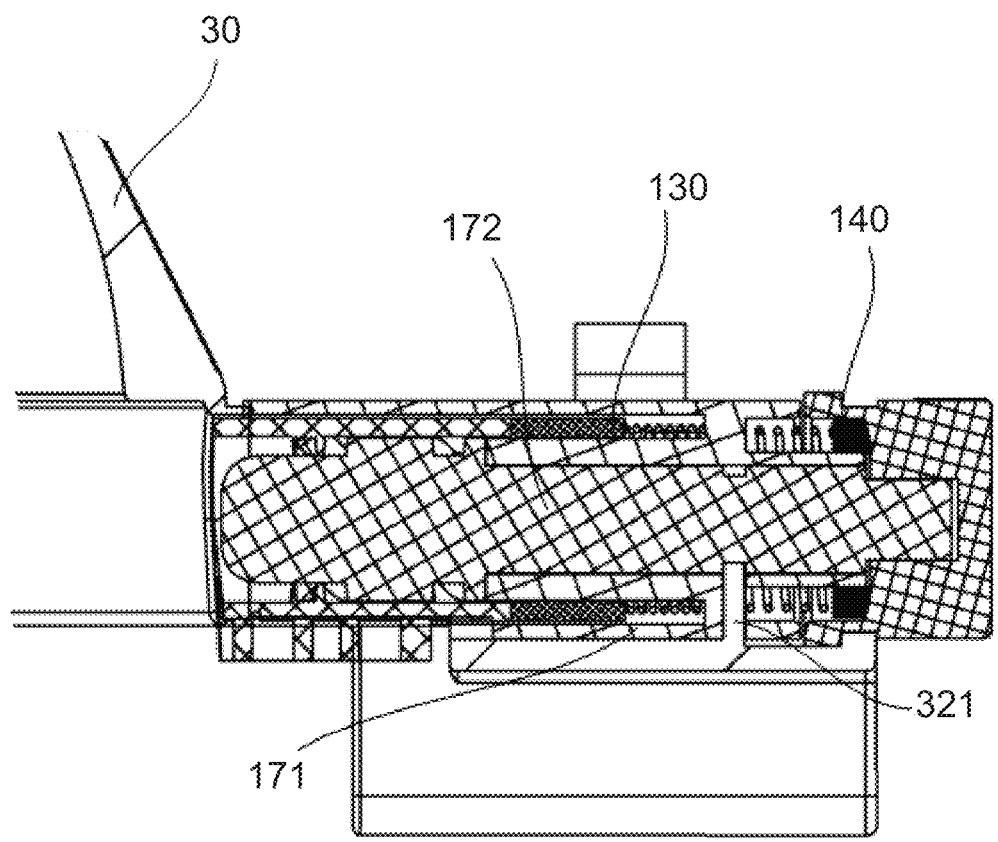
FIG. 31 is a schematic diagram illustrating an exemplary cross-section of an upper receiver coil portion connecting with an adjusting assembly according to some embodiments of the present disclosure.

As shown in FIGS. 27 and 28, the mounting shell 171 may include a first fixing groove 1711. In some embodiments, referring to FIG. 28, the first fixing groove 1711 may extend along a circumferential direction of the mounting shell 171. The adjusting rod 172 may include a second fixing groove 1223. In some embodiments, referring to FIG. 28, the second fixing groove 1223 may be located on the outer surface of the adjusting rod 172 and surround around the adjusting rod 172. The second fixing groove 1223 may correspond to the first fixing groove 1711 to determine a groove shared between the adjusting rod 172 and the mounting shell 171. As shown in FIG. 31, the second coil structure 300 may include a fixing block 321. When installing the adjusting assembly 120 on the second coil structure 300, the fixing block 321 may pass through the first fixing groove 1711 and extend into the second fixing groove 1223. In such a situation, second coil structure 300, the mounting shell 171, and the adjusting rod 172 may move synchronously with each other along a direction vertical to the extension direction of the groove shared between the adjusting rod 172 and the mounting shell 171. In some embodiments, extension direction of the groove shared between the adjusting rod 172 and the mounting shell 171 may be the same as the extension direction of the first fixing groove 1711 and/or the second fixing groove 1223. For example, when moving the adjusting rod 172 backward or forward along a direction (e.g., a direction along the rail 1213 shown in FIG. 4), through cooperation among the second fixing groove 1223, the fixing block 321, and the first fixing groove 1711, the adjusting rod 172 may drive the mounting shell 171 and the second coil structure 300 to synchronously move backward or forward along the direction.

As shown in FIG. 27, in some embodiments, the locking mechanism 100 may include an angle adjusting assembly 140. The angle adjusting assembly 140 may be configured to adjust a slope degree of the adjusting rod 172 in the adjusting assembly 120. In some embodiments, the angle adjusting assembly 140 and the self-locking assembly 130 may be separately positioned at the two sides of the second fixing groove 1223. For example, a fixing block of the second coil structure 300 may be positioned in the second fixing groove 1223, the angle adjusting assembly 140 and the self-locking assembly 130 may be separately positioned at the two sides of the fixing block (e.g., the fixing block 321 shown in FIG. 31).

In some embodiments, the angle adjusting assembly 140 may include the angle adjusting component 141 and the restoring component 142. The restoring component 142 may be arranged between the mounting shell 171 and the angle adjusting component 141 to make the angle adjusting component 141 butt joint with the knob 173.

The angle adjusting component 141 may be sheathed on the adjusting rod 172. A first end of the angle adjusting component 141 may be connected to the knob 173. A second end of the angle adjusting component 141 may be connected to the restoring component 142. In some embodiments, the first end of the angle adjusting component 141 may include a protruding position (e.g., two protruding parts). Between the two protruding parts, the angle adjusting component 141 may include an arc-shaped hollow part. The two protruding points may be connected to the knob 173 for transmission force between the angle adjusting component 141 and the knob 173. For example, the two protruding parts may correspond to the rotating position and the locking position separately. When the knob 173 is rotated to drive the adjusting rod 172 move from the rotating position to the locking position, the knob 173 may butt joint with the protruding position. When the knob 173 passes the protruding position, the arc-shaped hollow part may guide further rotation of the knob 173. That is to say, the protruding position (e.g., the two protruding parts) may be extreme position for rotation. Rotating the knob 173 along the protruding position, a bigger force is needed. When passing the protruding position and rotating along the arc-shaped hollow part, a smaller force may be applied to the knob 173.

The application of the protruding position may determine a minimum force to drive the knob 173 to rotate. Under such a design, undesired rotation of the knob 173 caused by accident touch or vibrations may be avoided. Only when a force applied to the knob 173 is larger than the minimum force, then the knob 173 may pass the protruding position and drive the adjusting rod 172 to a particular position.

In some embodiments, when the knob 173 is butt joint with the two protruding parts of the angle adjusting component 141, the knob 173 may compress the restoring component 142 through the angle adjusting component 141. In such a situation, rotating the knob 173 may lead to rotating the adjusting rod 172. When the knob 173 rotates to a particular location, losing the knob 173 (i.e., stopping providing force for rotating the knob 173), an elastic force for returning to an original state generated by the restoring component 142 may push the angle adjusting component 141 to be butt joint with the knob 173. In such a situation, rotating of the knob 173 may be limited and the location of the knob 173 may be fixed and reliable. In some embodiments, the restoring component 142 may include a spring.

FIG. 28 is an explosion diagram illustrating an exemplary self-locking assembly 130 according to some embodiments of the present disclosure. As shown in FIG. 28, the self-locking assembly 130 may include the self-locking slide 161, the elastic component 162. The self-locking slide 161 may include the second locking protuberance 1611 for connecting with the self-locking groove 1222 of the adjusting rod 172.

Figure 29:
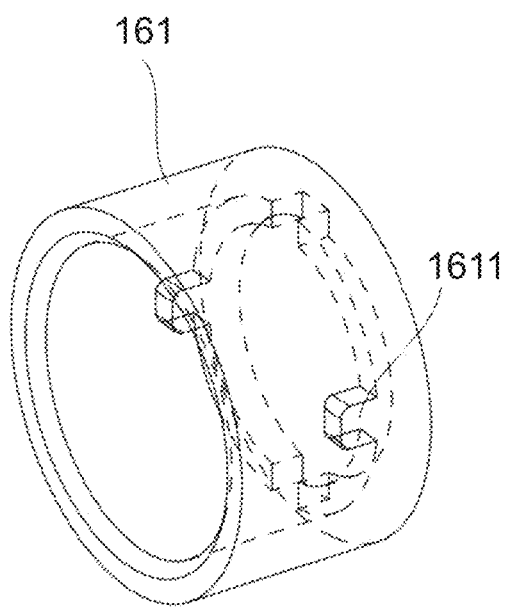
FIG. 29 is a schematic diagram illustrating a perspective view of an exemplary self-locking slide according to some embodiments of the present disclosure.

FIG. 29 is a schematic diagram illustrating a perspective view of an exemplary self-locking slide 161 according to some embodiments of the present disclosure. As shown in FIG. 29, the self-locking slide 161 may include a second locking protuberance 1611. The second locking protuberance 1611 may be positioned on the inner surface of the self-locking slide 161.

In some embodiments, the second locking protuberance 1611 may include a group of second locking sub-protuberances. The group of second locking sub-protuberances may be arranged evenly along a circle of a cross-section of the self-locking slide 161. For example, the second locking protuberance 1611 may include two second locking sub-protuberances. The two second locking sub-protuberances may be positioned opposites to each other on the inner surface of the second locking protuberance 1611. It should be understood that the count of second locking sub-protuberances may be different than two. For instance, one or more (e.g., 3, 5, 7) second locking sub-protuberances may be employed. Each of the second locking sub-protuberance may correspond to a self-locking groove 1222 on the adjusting rod 172 for limiting rotating of the adjusting rod 172.

Figure 30:
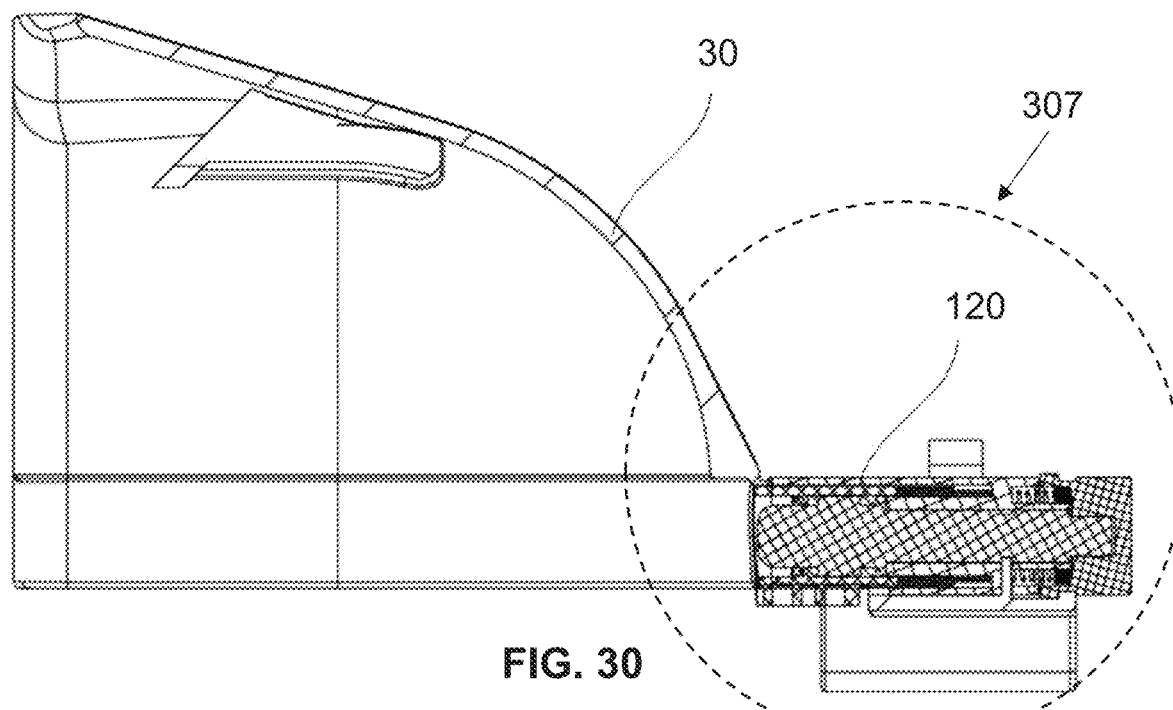
FIG. 30 is a schematic diagram illustrating an exemplary cross-section of an upper receiver coil portion connecting with an adjusting assembly according to some embodiments of the present disclosure.

FIG. 30 is a schematic diagram illustrating an exemplary cross-section of an upper receiver coil portion 30 connecting with an adjusting assembly 120 according to some embodiments of the present disclosure. As shown in FIG. 30, the upper receiver coil portion 30 may be connected with the adjusting assembly 120 through one or more components shown in a circle 307. An enlarged view of the one or more components shown in the circle 307 may be found in FIG. 31.

FIG. 31 is a schematic diagram illustrating an exemplary cross-section of an upper receiver coil portion 30 connecting with an adjusting assembly 120 according to some embodiments of the present disclosure. FIG. 31 is an enlarged view of one or more components as shown in the circle 307 of FIG. 30.

As shown in FIG. 31, the upper receiver coil portion 30 may be connected with the adjusting assembly 120. The fixing block 321 may match with the first fixing groove 1711 (shown in FIGS. 27 and 28) for installing the adjusting assembly 120 on the upper receiver coil portion 30. More details regarding the fixing block and its application may be found elsewhere in the present disclosure. See, e.g., the description in connection with the fixing block 321 and the first fixing groove 1711 in FIGS. 27-28.

It should be noted that the above description of the embodiments is provided for the purposes of comprehending the present disclosure, and not intended to limit the scope of the present disclosure. For persons having ordinary skills in the art, various variations and modifications may be conducted in the light of the present disclosure. For example, more than one locking mechanism 100 may be employed for locking the first coil structure 200 and the second coil structure 300. However, those variations and the modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "block," "module," "engine," "unit," "component," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Rubyand Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

It is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A magnetic resonance imaging (MRI) coil device, comprising:
   a transmitter coil assembly including a first shell, wherein the first shell defines a cavity;
   a first receiver coil portion,
   a second receiver coil portion configured to fit with the first receiver coil portion to provide a receiver coil assembly located in the cavity, the second receiver coil portion being moveable relative to the first receiver coil portion, wherein the second receiver coil portion includes a connecting rod and the transmitter coil assembly is moveable along the connecting rod, and
   a locking mechanism configured to limit relative movement between the first receiver coil portion and the second receiver coil portion when the first receiver coil portion and the second receiver coil portion are fit together.

2. The device of claim 1, wherein
   the second receiver coil portion is fixed in an upper portion of the cavity, and
   the first shell is configured to support a transmitter coil of the transmitter coil assembly.

3. The device of claim 1, wherein
   the second receiver coil portion is an upper portion of the receiver coil assembly, and
   the first receiver coil portion is a lower portion of the receiver coil assembly.

4. The device of claim 2, wherein
   the first receiver coil portion includes a second shell; and
   the locking mechanism connects the first shell with the second shell to limit relative movement between the first shell and the second shell, so that the relative movement of the second receiver coil portion to the first receiver coil portion is limited.

5. The device of claim 4, wherein the first shell includes a first connector end, the second shell includes a second connector end, wherein the first connector end and the second connector end are complementary.

6. The device of claim 4, wherein
   the second shell includes a container groove extending along an axial direction of the second shell; and
   the container groove is configured to support an object.

7. The device of claim 6, wherein
   the container groove includes a first end and a second end along the axial direction of the second shell;
   the first end is an end from which the object moves in and out of the container groove; and
   the second end is higher than the first end to allow the container groove to tilt along the axial direction of the second shell.

8. The device of claim 2, wherein
   the first shell includes a tube-shaped structure;
   the second receiver coil portion is arranged inside of the tube-shaped structure; and a space between the second receiver coil portion and the transmitter coil is formed by a part of the tube-shaped structure.

9. The device of claim 8, wherein the transmitter coil is arranged on an outside surface of the tube-shaped structure.

10. The device of claim 2, wherein the second receiver coil portion includes
a second receiver coil, and
an upper supporting structure configured to support the second receiver coil.

11. The device of claim 10, wherein
the upper supporting structure includes a window;
the first shell includes a channel for observation; and
the channel extends from an end of the first shell to the window.

12. The device of claim 11, wherein
a periscope is positioned at a location of the window; and
the periscope is arranged at an angle to an extension direction of the channel.

13. The device of claim 2, wherein
the second receiver coil portion includes a first supporting structure and a second supporting structure, the first supporting structure being positioned at a first end of the second receiver coil portion, and the second supporting structure being positioned at a second end of the second receiver coil portion; and
the transmitter coil assembly is moveable in a range limited by the first supporting structure and the second supporting structure.

14. The device of claim 13, wherein
connecting rod is connected to both the first supporting structure and the second supporting structure
and configured to support the transmitter coil assembly.

15. The device of claim 14, wherein
the transmitter coil assembly includes a through hole; and
the connecting rod passes through the through hole.

16. A method comprising:
providing a transmitter coil assembly including a first shell, wherein the first shell defines a cavity;
providing a receiver coil assembly located in the cavity, the receiver coil assembly including a second receiver coil portion and a first receiver coil portion, wherein the second receiver coil portion includes a connecting rod and the transmitter coil assembly is moveable along the connecting rod;
providing a locking mechanism configured to limit relative movement between the second receiver coil portion and the first receiver coil portion when the second receiver coil portion and the first receiver coil portion are fit together;
causing the second receiver coil portion to move relatively to the first receiver coil portion of the receiver coil assembly until the second receiver coil portion and the first receiver coil portion are fit together; and
locking the second receiver coil portion with the first receiver coil portion based on a locking mechanism to set a relative movement limitation between the second receiver coil portion and the first receiver coil portion.

17. The method of claim 16, further comprising:
unlocking the second receiver coil portion from the first receiver coil portion by releasing the locking mechanism to revoke the relative movement limitation between the second receiver coil portion and the first receiver coil portion.

18. The method of claim 16, wherein the locking mechanism includes a knob, the locking the second receiver coil portion with the first receiver coil portion based on a locking mechanism comprising:
rotating the knob along a first direction.

19. The method of claim 16, wherein the second receiver coil portion is fixed to the transmitter coil assembly, the causing the second receiver coil portion of a receiver coil assembly to move relatively to the first receiver coil portion of the receiver coil assembly comprising:
causing the transmitter coil assembly to move toward the first receiver coil portion.

20. The method of claim 19, wherein the connecting rod is configured to support the transmitter coil assembly, the causing the transmitter coil assembly to move toward the first receiver coil portion comprising:
causing the transmitter coil assembly to move along the connecting rod.

* * * * *